(12) United States Patent
Toyotaka

(10) Patent No.: US 8,718,224 B2
(45) Date of Patent: May 6, 2014

(54) PULSE SIGNAL OUTPUT CIRCUIT AND SHIFT REGISTER

(75) Inventor: Kouhei Toyotaka, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/561,499

(22) Filed: Jul. 30, 2012

(65) Prior Publication Data

US 2013/0034199 A1   Feb. 7, 2013

(30) Foreign Application Priority Data

Aug. 5, 2011   (JP) ................... 2011-172111

(51) Int. Cl.
G11C 19/00   (2006.01)

(52) U.S. Cl.
USPC .................. 377/64; 377/78; 377/79

(58) Field of Classification Search
None
See application file for complete search history.

(56) References Cited

U.S. PATENT DOCUMENTS

| | | | |
|---|---|---|---|
| 3,588,526 A * | 6/1971 | Cricchi | 377/79 |
| 3,745,371 A * | 7/1973 | Suzuki | 377/79 |
| 3,862,435 A * | 1/1975 | Salters et al. | 377/68 |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,304,105 B1 | 10/2001 | Fujiyoshi | |
| 6,563,174 B2 | 5/2003 | Kawasaki et al. | |
| 6,727,522 B1 | 4/2004 | Kawasaki et al. | |
| 6,813,332 B2 | 11/2004 | Nagao et al. | |
| 6,845,140 B2 | 1/2005 | Moon et al. | |
| 6,975,142 B2 | 12/2005 | Azami et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,071,765 B2 | 7/2006 | Kamijo | |
| 7,105,868 B2 | 9/2006 | Nause et al. | |
| 7,116,748 B2 | 10/2006 | Nagao et al. | |
| 7,211,825 B2 | 5/2007 | Shih et al | |
| 7,282,782 B2 | 10/2007 | Hoffman et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

Primary Examiner — Tuan T Lam
(74) Attorney, Agent, or Firm — Fish & Richardson P.C.

(57) ABSTRACT

To provide a pulse signal output circuit capable of operating stably and a shift register including the pulse signal output circuit. A pulse signal output circuit includes a plurality of transistors each including an oxide semiconductor. In accordance with operations of the pulse signal output circuit, the threshold voltage of the transistor including an oxide semiconductor is changed. A shift register including the pulse signal output circuit is formed. A pulse signal output circuit capable of operating stably and a shift register including the pulse signal output circuit can be provided.

20 Claims, 15 Drawing Sheets

(56) References Cited

U.S. PATENT DOCUMENTS

| | | |
|---|---|---|
| 7,297,977 B2 | 11/2007 | Hoffman et al. |
| 7,323,356 B2 | 1/2008 | Hosono et al. |
| 7,324,123 B2 | 1/2008 | Yamazaki et al. |
| 7,369,111 B2 | 5/2008 | Jeon et al. |
| 7,385,224 B2 | 6/2008 | Ishii et al. |
| 7,397,885 B2 | 7/2008 | Moon et al. |
| 7,402,506 B2 | 7/2008 | Levy et al. |
| 7,411,209 B2 | 8/2008 | Endo et al. |
| 7,443,202 B2 | 10/2008 | Kimura et al. |
| 7,450,681 B2 | 11/2008 | Wei et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,511,709 B2 | 3/2009 | Koyama et al. |
| 7,586,478 B2 | 9/2009 | Azami et al. |
| 7,590,214 B2 | 9/2009 | Liu et al. |
| 7,674,650 B2 | 3/2010 | Akimoto et al. |
| 7,696,974 B2 | 4/2010 | Moon et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2004/0140839 A1 | 7/2004 | Nagao et al. |
| 2005/0017302 A1 | 1/2005 | Hoffman |
| 2005/0062515 A1 | 3/2005 | Nagao et al. |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0244391 A1 | 11/2006 | Shishido et al. |
| 2006/0244699 A1 | 11/2006 | Yamazaki |
| 2006/0280279 A1 | 12/2006 | Nagao et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0247932 A1 | 10/2007 | Tobita |
| 2007/0252928 A1 | 11/2007 | Ito et al. |
| 2007/0272922 A1 | 11/2007 | Kim et al. |
| 2007/0287296 A1 | 12/2007 | Chang |
| 2007/0296660 A1 | 12/2007 | Kimura et al. |
| 2008/0006877 A1 | 1/2008 | Mardilovich et al. |
| 2008/0011861 A1 | 1/2008 | Ikeda et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0062112 A1 | 3/2008 | Umezaki |
| 2008/0073653 A1 | 3/2008 | Iwasaki |
| 2008/0079001 A1 | 4/2008 | Umezaki et al. |
| 2008/0080661 A1 | 4/2008 | Tobita |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0258998 A1 | 10/2008 | Miyake |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2008/0308806 A1 | 12/2008 | Akimoto et al. |
| 2009/0002590 A1 | 1/2009 | Kimura |
| 2009/0008639 A1 | 1/2009 | Akimoto et al. |
| 2009/0027083 A1 | 1/2009 | Kimura et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0239335 A1 | 9/2009 | Akimoto et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2009/0322716 A1 | 12/2009 | Azami et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0134476 A1 | 6/2010 | Zebedee et al. |
| 2010/0134708 A1 | 6/2010 | Kimura et al. |
| 2010/0136743 A1 | 6/2010 | Akimoto et al. |
| 2010/0163874 A1 | 7/2010 | Koyama et al. |
| 2011/0084960 A1 | 4/2011 | Miyake et al. |
| 2011/0148846 A1 | 6/2011 | Arasawa et al. |
| 2011/0216874 A1 | 9/2011 | Toyotaka |
| 2011/0216875 A1 | 9/2011 | Miyake |
| 2011/0216876 A1 | 9/2011 | Amano et al. |
| 2011/0285675 A1 | 11/2011 | Amano et al. |
| 2011/0285688 A1 | 11/2011 | Miyake et al. |
| 2012/0076256 A1 | 3/2012 | Yonemaru et al. |
| 2012/0082287 A1 | 4/2012 | Moriwaki |
| 2012/0087459 A1 | 4/2012 | Nakamizo et al. |
| 2012/0087460 A1 | 4/2012 | Moriwaki |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-242020 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2001-044820 A | 2/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-226429 A | 8/2004 |

(56) References Cited

FOREIGN PATENT DOCUMENTS

| JP | 2004-273614 A | 9/2004 |
|---|---|---|
| JP | 2004-273732 A | 9/2004 |
| JP | 2005-012944 A | 1/2005 |
| JP | 2007-096055 A | 4/2007 |
| JP | 2007-123861 A | 5/2007 |
| JP | 2007-317344 A | 12/2007 |
| JP | 2008-122939 A | 5/2008 |
| JP | 2009-177296 A | 8/2009 |
| JP | 2009-302631 A | 12/2009 |
| JP | 2010-033690 A | 2/2010 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for Amoled Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: the Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTs," SID Digest '08 : TFT,' SID Digest '09 : SID International Symposium Digest of Technical Papers, May 20, 2008, vol. 39, pp. 621-624.

Hirao, T et al.. "Novel Top-Gate Zinc Oxide Thin-Film Transistors (ZnO TFTs) for AMLCDs," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al.. "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5),.InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure Rfid Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

(56) References Cited

OTHER PUBLICATIONS

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the $In_2O_3$—$Ga_2ZnO_4$—$ZnO$ system at 1350® C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "TRoom-Temperature Fabrication of Transparent Flexible Thin-Film Transistors Using Amorphous Oxide Semiconductors," Nature, Nov. 25, 2004, vol. 432, pp. 488-492

Nomura, K et al., "Carrier transport in transparent oxide semiconductor with intrinsic structural randomness probed using single-crystalline $InGaO_3(ZnO)_5$ films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDds," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTs With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide $InGaO_3(ZnO)m$ (m<4):a Zn4s conductor," Philosophical Magazine, 2001, vol. 81, No. 5, pp. 501-515.

Orita, M et al., "Mechanism of Electrical Conductivity of Transparent $InGaZnO_4$," Phys. Rev. B (Physical Review. B), Jan. 15, 2000, vol. 61, No. 3, pp. 1811-1816.

Osada, T et al.. "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci, Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park. J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc—Oxide TFTs and Their Application for Large Size AMOLED," AM-FPD '08 Digest of Technical Papers, Jul. 2, 2008, pp. 275-278.

Park. S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTs," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on $SrTiO_3$ With Sputtered $Al_2O_3$ Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

Masahiko Nakamizo et al.; "4.2: A Low Power Consumption and High Reliability Architecture for a-Si TFT Gate Driver on Glass"; SID Digest '10 : SID International Symposium Digest of Technical Papers; 2010, pp. 28-31.

* cited by examiner

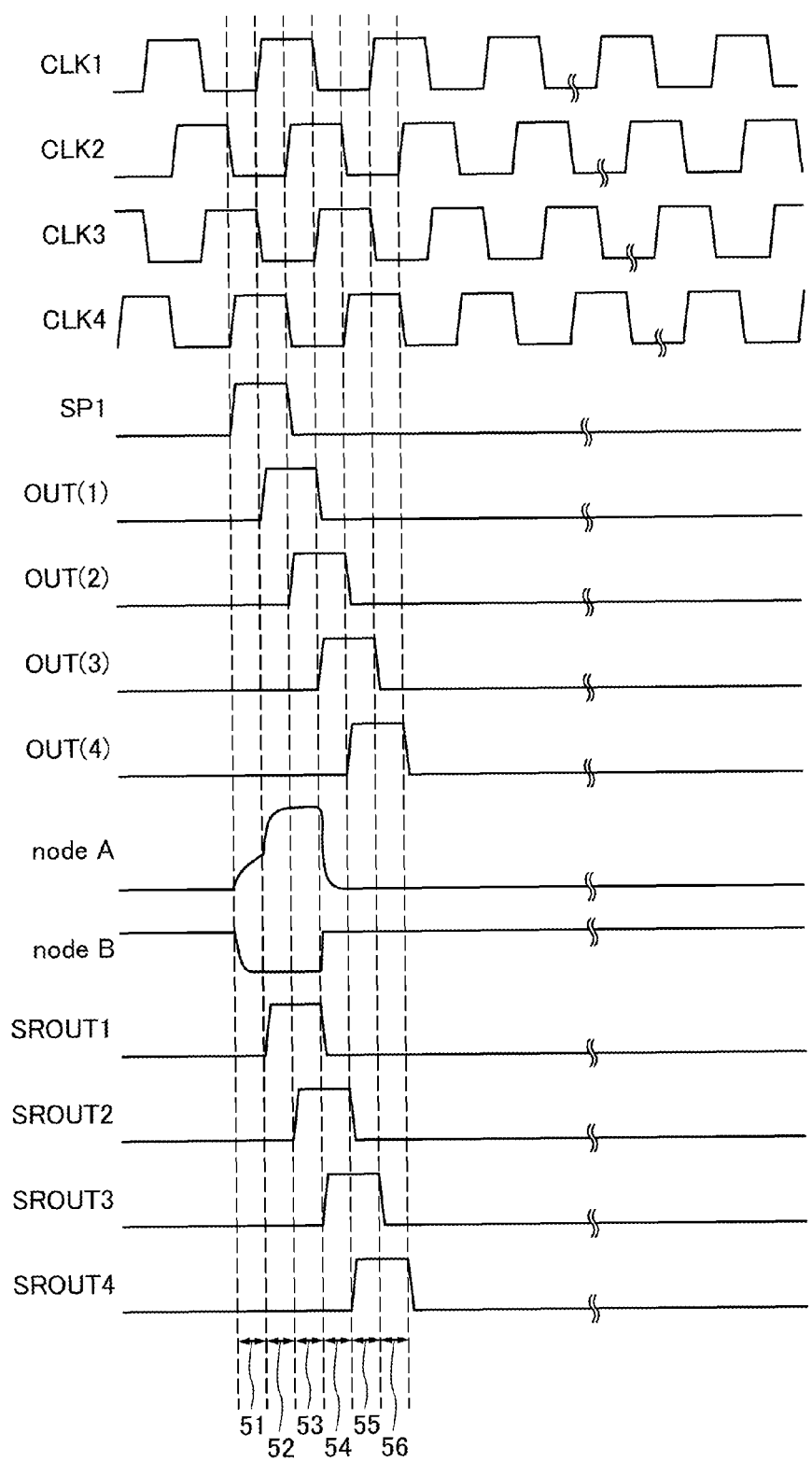

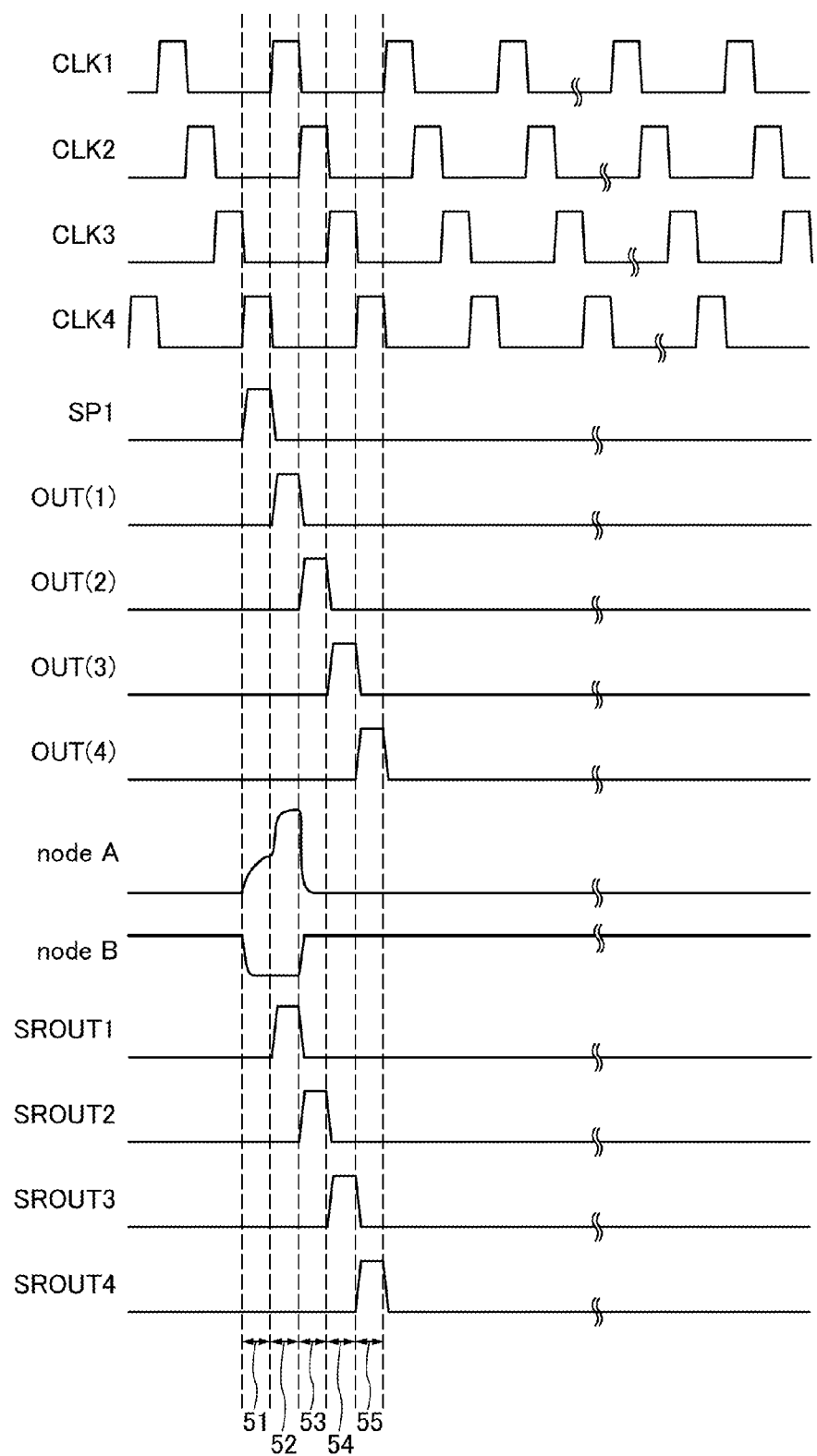

PULSE SIGNAL OUTPUT CIRCUIT AND SHIFT REGISTER

BACKGROUND OF THE INVENTION

1. Field of the Invention

The disclosed invention relates to a pulse signal output circuit and a shift register.

2. Description of the Related Art

Transistors which are formed over flat plates such as glass substrates and typically used in liquid crystal display devices generally include semiconductor materials such as amorphous silicon or polycrystalline silicon. Although transistors including amorphous silicon have low field-effect mobility, they can be formed over larger glass substrates. In contrast, although transistors including polycrystalline silicon have high field-effect mobility, they need a crystallization process such as laser annealing and are not always suitable for larger glass substrates.

On the other hand, transistors including oxide semiconductors as semiconductor materials have attracted attention. For example, Patent Documents 1 and 2 disclose a technique by which a transistor is formed using zinc oxide or an In—Ga—Zn—O-based oxide semiconductor as a semiconductor material and the transistor is used as a switching element of an image display device.

Transistors including oxide semiconductors in channel regions have higher field-effect mobility than transistors including amorphous silicon. Further, oxide semiconductor layers can be formed at a temperature of 300° C. or lower by sputtering or the like, and the manufacturing process thereof is simpler than that of the transistors including polycrystalline silicon.

Such transistors including oxide semiconductors are expected to be used as switching elements included in pixel portions and driver circuits of display devices such as liquid crystal displays, electroluminescent displays, and electronic papers. For example, Non-Patent Document 1 discloses a technique by which a pixel portion and a driver circuit of a display device include the transistors including oxide semiconductors.

Note that the transistors including oxide semiconductors are all n-channel transistors. Therefore, in the case where a driver circuit includes transistors including oxide semiconductors, the driver circuit includes only n-channel transistors.

REFERENCE

Patent Document

[Patent Document 1] Japanese Published Patent Application No. 2007-123861
[Patent Document 2] Japanese Published Patent Application No. 2007-096055

Non-Patent Document

[Non-Patent Document 1] T. Osada et al., "Development of Driver-Integrated Panel using Amorphous In—Ga—Zn—Oxide TFT", *Proc. SID '09 Digest*, 2009, pp. 184-187.

SUMMARY OF THE INVENTION

A driver circuit which is used in a display device or the like includes a shift register having a pulse signal output circuit, for example. When the shift register is formed using a transistor whose channel region is formed using an oxide semiconductor, the transistor might become a depletion (also referred to as normally-on) transistor due to change in the threshold voltage, or the like. In the case of using the normally-on transistor, there are problems in that an increase in the power consumption and malfunction such as an abnormal output signal might be caused by leakage current from the transistor.

The degree of change in the threshold voltage varies among substrates in some cases. In circuit design where countermeasures against the case where the transistors become normally-on transistors are taken in advance, there might be a problem in that it is difficult to take countermeasures against the variations. Therefore, it is necessary to employ circuit design of a driver circuit with which an increase in the power consumption and malfunction are not caused regardless of the degree of change in the threshold voltage at which a transistor functions as a normally-on transistor.

In view of the problem, an object is to provide a pulse signal output circuit capable of operating stably and a shift register including the pulse signal output circuit.

One embodiment of the present invention is a pulse signal output circuit including a plurality of transistors each including an oxide semiconductor. In accordance with operations of the pulse signal output circuit, the threshold voltage of the transistor including an oxide semiconductor is changed. One embodiment of the present invention is a shift register including the pulse signal output circuit.

As an example of a transistor whose threshold voltage can be controlled, an element which includes at least the following four terminals is given: a first gate terminal (also referred to as a first gate); a second gate terminal (also referred to as a second gate); a drain terminal (also referred to as a drain); and a source terminal (also referred to as a source). A transistor including the four terminals has a channel region between a drain region and a source region in a semiconductor film, and current can flow between the drain region and the source region through the channel region. The transistor including the four terminals has a first gate and a second gate on the upper side and lower side of the channel region. Then, a signal for controlling switching of conduction (an on state) and non-conduction (an off state) of the transistor is supplied to the first gate. A signal for controlling the threshold voltage of the transistor is supplied to the second gate.

In the transistor including the four terminals, a terminal connected to a wiring for supplying a high potential (e.g., VDD) is described as a drain terminal and a terminal connected to a wiring for supplying a low potential (e.g., VSS) is described as a source terminal in some cases. Note that the drain terminal is referred to as a first terminal and the source terminal is referred to as a second terminal in some cases.

A pulse signal output circuit includes the plurality of transistors each including four terminals.

According to one embodiment of the present invention, a pulse signal output circuit includes first to tenth transistors each including a source terminal, a drain terminal, a first gate terminal, and a second gate terminal; first to fourth input terminals; first and second output terminals; and first to fourth power supply lines. The drain terminal of the first transistor is connected to the first input terminal and the source terminal of the first transistor is connected to the first output terminal. The drain terminal of the second transistor is connected to the first output terminal and the source terminal of the second transistor is connected to the first power supply line. The drain terminal of the third transistor is connected to the first input terminal and the source terminal of the third transistor is connected to the second output terminal. The drain terminal of the fourth transistor is connected to the second output terminal and the source terminal of the fourth transistor is connected to the first power supply line. The drain terminal of the fifth transistor is connected to the second power supply line and the source terminal of the fifth transistor is connected to the drain terminal of the sixth transistor and the drain terminal of the seventh transistor. The source terminal of the sixth transistor is connected to the first power supply line and the first gate terminal of the sixth transistor is connected to the source terminal of the eighth transistor, the drain terminal of the ninth transistor, the first gate terminal of the second transistor, and the first gate terminal of the fourth transistor. The source terminal of the seventh transistor is connected to the first gate terminal of the first transistor and the first gate terminal of the third transistor and the first gate terminal of the seventh transistor is connected to the second power supply line. The drain terminal of the eighth transistor is connected to the source terminal of the tenth transistor, the first gate terminal of the eighth transistor is connected to the second input terminal, and the second gate terminal of the eighth transistor is connected to the third power supply line. The source terminal of the ninth transistor is connected to the first power supply line. The drain terminal of the tenth transistor is connected to the second power supply line, the first gate terminal of the tenth transistor is connected to the third input terminal, and the second gate terminal of the tenth transistor is connected to the third power supply line. The first output terminal is connected to the second gate terminal of the first transistor and the second gate terminal of the third transistor. The fourth input terminal is connected to the first gate terminal of the fifth transistor, the second gate terminal of the fifth transistor, and the first gate terminal of the ninth transistor. The third power supply line is connected to the second gate terminal of the second transistor, the second gate terminal of the fourth transistor, the second gate terminal of the sixth transistor, and the second gate terminal of the ninth transistor. The fourth power supply line is connected to the second gate terminal of the seventh transistor.

In the above structure, the pulse signal output circuit may further include a capacitor. The capacitor is electrically connected to the first gate terminal of the second transistor, the first gate terminal of the fourth transistor, the first gate terminal of the sixth transistor, the source terminal of the eighth transistor, and the drain terminal of the ninth transistor.

In the above structures, the pulse signal output circuit may further include an eleventh transistor. A drain terminal of the eleventh transistor is connected to the second power supply line. A source terminal of the eleventh transistor is connected to the first gate terminal of the second transistor, the first gate terminal of the fourth transistor, the first gate terminal of the sixth transistor, the source terminal of the eighth transistor, and the drain terminal of the ninth transistor.

In the above structures, a first potential is supplied to the first power supply line, a second potential that is higher than the first potential is supplied to the second power supply line, a third potential that is higher than the first potential and lower than the second potential is supplied to the fourth power supply line, and a potential that is lower than the third potential is supplied to the third power supply line.

In the above structure, a first clock signal is input to the first input terminal, a second clock signal is input to the second input terminal, a third clock signal is input to the third input terminal, and a fourth clock signal is input to the fourth input terminal.

A shift register can include a plurality of pulse signal output circuits with the above structure.

According to one embodiment of the present invention, a pulse signal output circuit capable of operating stably and a shift register including the pulse signal output circuit can be provided.

BRIEF DESCRIPTION OF THE DRAWINGS

FIG. 2 is a timing chart of the shift register.
FIG. 8 is a timing chart of the shift register.

DETAILED DESCRIPTION OF THE INVENTION

Figure 1A:
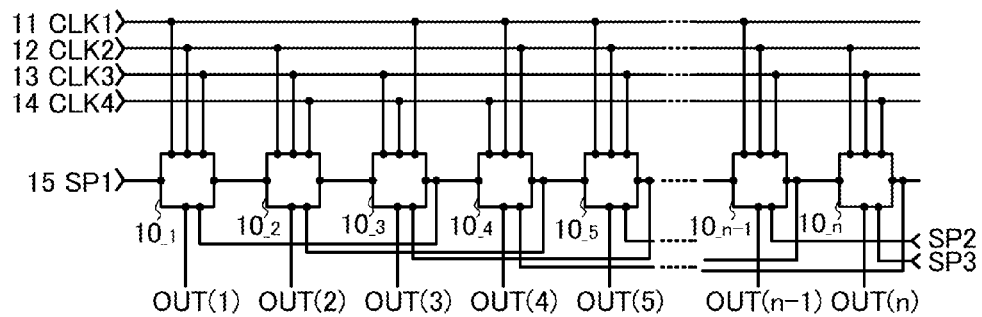
FIGS. 1A to 1C illustrate configuration examples of a pulse signal output circuit and a shift register.

Examples of embodiments of the present invention will be described below with reference to the drawings. Note that the present invention is not limited to the following description. It will be readily appreciated by those skilled in the art that modes and details of the present invention can be changed in various ways without departing from the spirit and scope of the present invention. Therefore, the present invention should not be construed as being limited to the following description of the embodiments.

Note that the position, size, range, or the like of each component illustrated in drawings and the like is not accurately represented in some cases for easy understanding. Therefore, the disclosed invention is not necessarily limited to the position, size, range, or the like disclosed in the drawings and the like.

Note that in this specification and the like, ordinal numbers such as "first", "second", and "third" are used in order to avoid confusion among components and do not limit the number.

Note that in this specification and the like, the term such as "over" or "below" does not necessarily mean that a component is placed "directly on" or "directly under" another component. For example, the expression "a gate electrode over a gate insulating layer" does not exclude the case where another component is placed between the gate insulating layer and the gate electrode. Moreover, the terms such as "over" and "below" are used simply for convenience of explanation.

In addition, in this specification and the like, the term such as "electrode" or "wiring" does not limit a function of a component. For example, an "electrode" is sometimes used as part of a "wiring", and vice versa. In addition, the term "electrode" or "wiring" can also mean a combination of a plurality of "electrodes" and "wirings", for example.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification.

Note that in this specification and the like, the term "electrically connected" includes the case where components are connected through an object having any electric function. There is no particular limitation on an object having any electric function as long as electric signals can be transmitted and received between components that are connected through the object.

Embodiment 1

In this embodiment, configuration examples of a pulse signal output circuit and a shift register including the pulse signal output circuit will be described with reference to FIGS. 1A to 1C, FIG. 2, FIG. 3, FIGS. 4A to 4C, FIGS. 5A to 5C, and FIGS. 6A to 6C.

<Circuit Configuration>

First, configuration examples of a pulse signal output circuit and a shift register including the pulse signal output circuit are described with reference to FIGS. 1A to 1C.

A shift register described in this embodiment includes first to n-th pulse signal output circuits $10\_1$ to $10\_n$ (n is a natural number greater than or equal to 2) and signal lines 11 to 14 which transmit clock signals (see FIG. 1A). A clock signal CLK1 is supplied to the signal line 11. A clock signal CLK2 is supplied to the signal line 12. A clock signal CLK3 is supplied to the signal line 13. A clock signal CLK4 is supplied to the signal line 14.

The clock signal is a signal which alternates between a High signal at a high potential (hereinafter denoted by H-level signal) and a Low signal at a low potential (hereinafter denoted by L-level signal) at regular intervals. Here, the clock signals CLK1 to CLK4 are delayed by ¼ period sequentially. In this embodiment, by using the clock signals, control or the like of the pulse signal output circuit is performed.

Figure 1B:
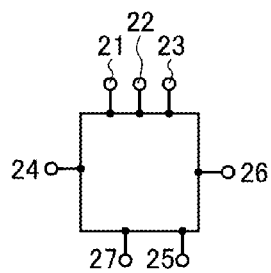

Each of the first to n-th pulse signal output circuits $10\_1$ to $10\_n$ includes an input terminal 21, an input terminal 22, an input terminal 23, an input terminal 24, an input terminal 25, an output terminal 26, and an output terminal 27 (see FIG. 1B).

The input terminal 21, the input terminal 22, and the input terminal 23 are electrically connected to any of the first to fourth signal lines 11 to 14. For example, the input terminal 21 in the first pulse signal output circuit $10\_1$ is electrically connected to the signal line 11, the input terminal 22 in the first pulse signal output circuit $10\_1$ is electrically connected to the signal line 12, and the input terminal 23 in the first pulse signal output circuit $10\_1$ is electrically connected to the signal line 13. In addition, the input terminal 21 in the second pulse signal output circuit $10\_2$ is electrically connected to the signal line 12, the input terminal 22 in the second pulse signal output circuit $10\_2$ is electrically connected to the signal line 13, and the input terminal 23 in the second pulse signal output circuit $10\_2$ is electrically connected to the signal line 14. Note that here, the case where the signal lines 12 to 14 are connected to the n-th pulse signal output circuit $10\_n$ is described. However, the signal line that is connected to the n-th pulse signal output circuit $10\_n$ is changed depending on the value of n. Thus, it is to be noted that the configuration described herein is just an example.

In the m-th pulse signal output circuit (m is a natural number greater than or equal to 2) of the shift register described in this embodiment, the input terminal 24 in the m-th pulse signal output circuit is electrically connected to the output terminal 26 in the (m−1)th pulse signal output circuit. The input terminal 25 in the m-th pulse signal output circuit is electrically connected to the output terminal 26 in the (m+2)th pulse signal output circuit. The output terminal 26 in the m-th pulse signal output circuit is electrically connected to the input terminal 24 in the (m+1)th pulse signal output circuit and the input terminal 25 in the (m−2)th pulse signal output circuit. The output terminal 27 in the m-th pulse signal output circuit outputs a signal to an OUT(m).

For example, the input terminal 24 in the third pulse signal output circuit $10\_3$ is electrically connected to the output terminal 26 in the second pulse signal output circuit $10\_2$. The input terminal 25 in the third pulse signal output circuit $10\_3$ is electrically connected to the output terminal 26 in the fifth pulse signal output circuit $10\_5$. The output terminal 26 in the third pulse signal output circuit $10\_3$ is electrically connected to the input terminal 24 in the fourth pulse signal output circuit $10\_4$ and the input terminal 25 in the first pulse signal output circuit $10\_1$.

In addition, a start pulse (SP1) is input from a wiring 15 to the input terminal 24 in the first pulse signal output circuit $10\_1$. Note that the start pulse is a clock signal. A pulse output from the previous stage is input to the input terminal 24 in the k-th pulse signal output circuit $10\_k$ (k is a natural number greater than or equal to 2 and less than or equal to n). A start pulse (SP2) is input to the input terminal 25 in the (n−1)th pulse signal output circuit $10\_{n-1}$. A start pulse (SP3) is input to the input terminal 25 in the n-th pulse signal output circuit $10\_n$. The start pulse (SP2) and the start pulse (SP3) may be input from the outside or generated inside the circuit.

Next, specific configurations of the first to n-th pulse signal output circuits $10\_1$ to $10\_n$ is described.

Figure 1C:
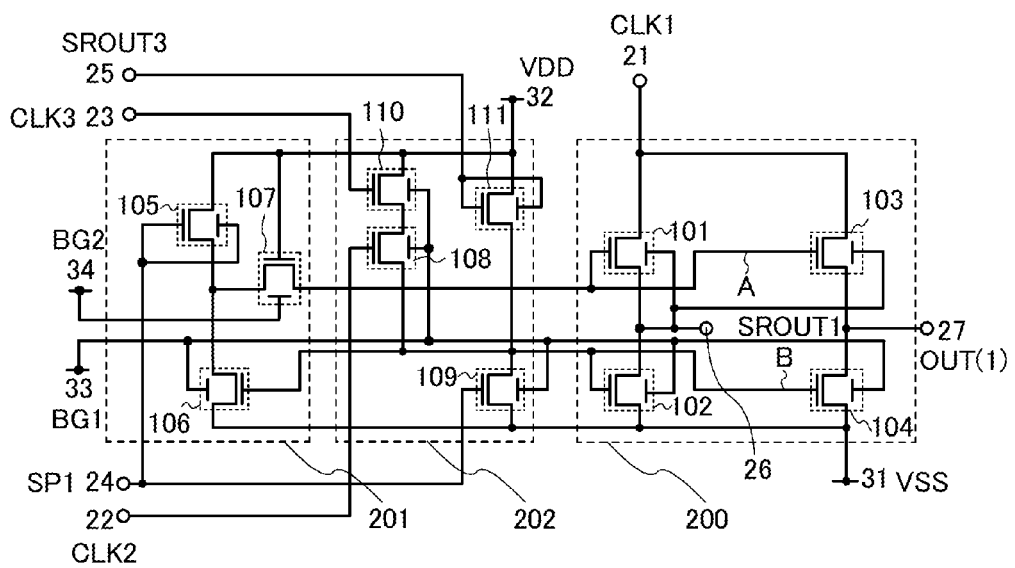
Figure 3:
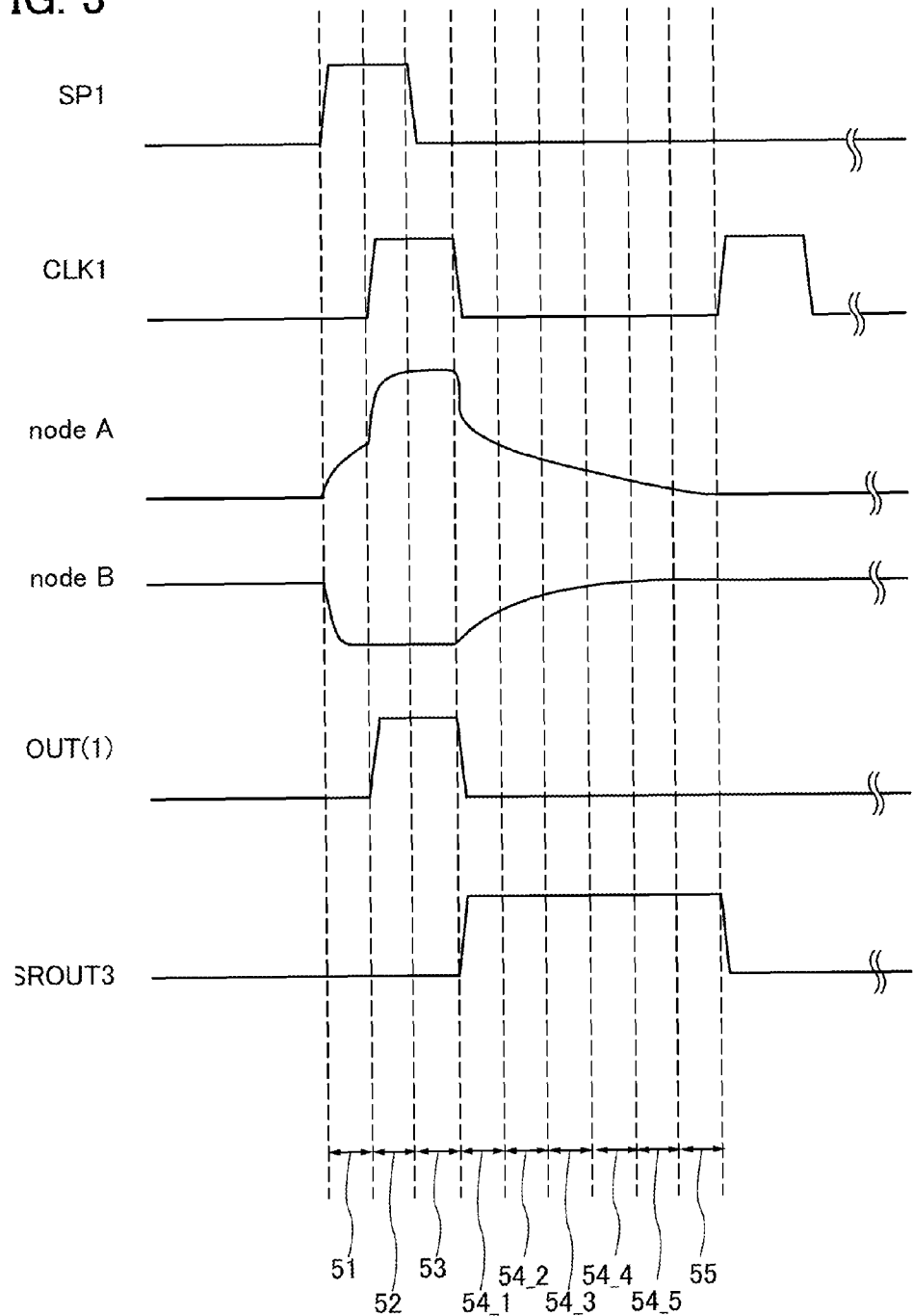
FIG. 3 is a timing chart of the shift register.
Figure 4A:
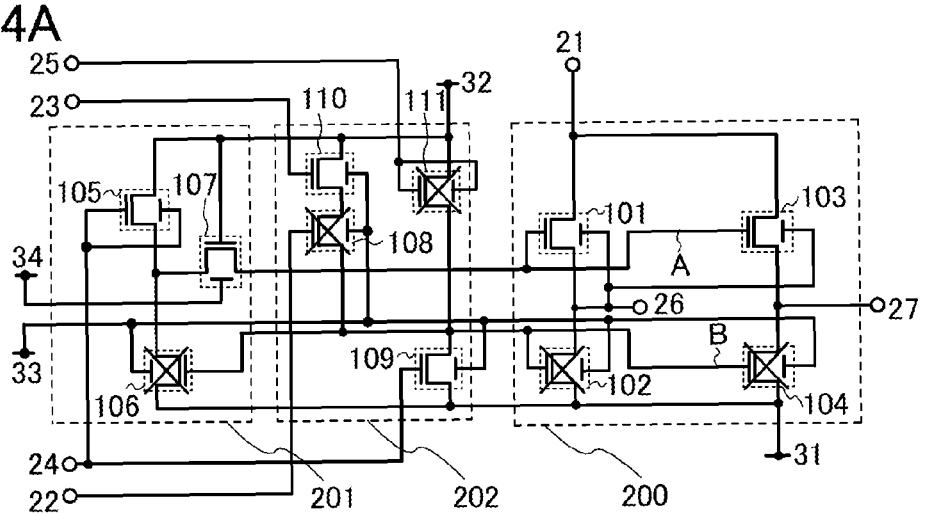
FIGS. 4A to 4C illustrate operation of the pulse signal output circuit.
Figure 4B:
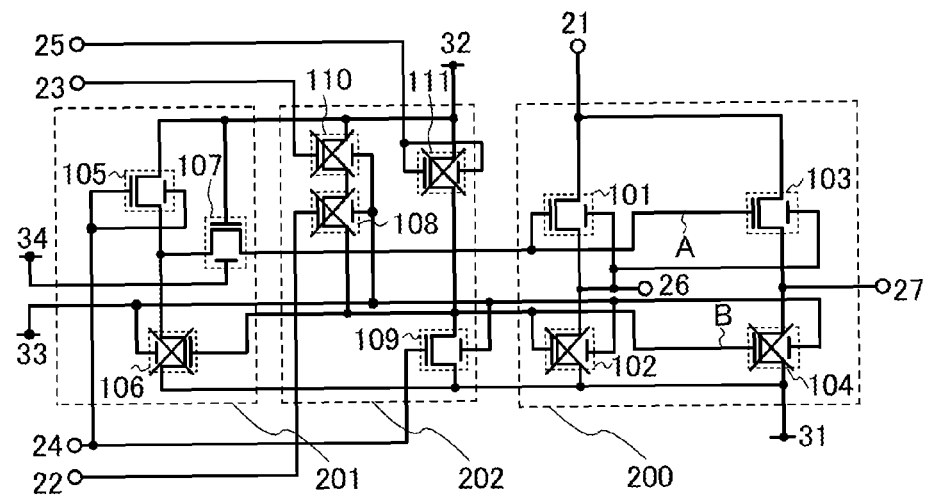
Figure 4C:
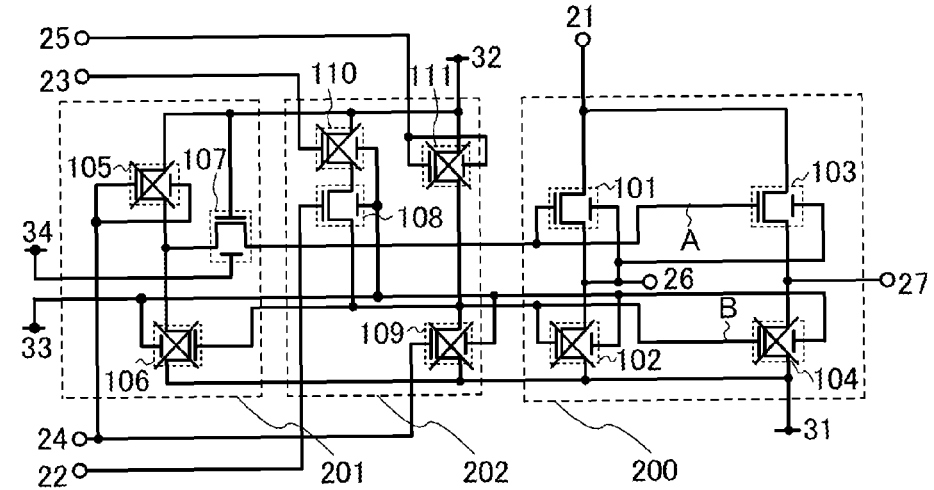
Figure 5A:
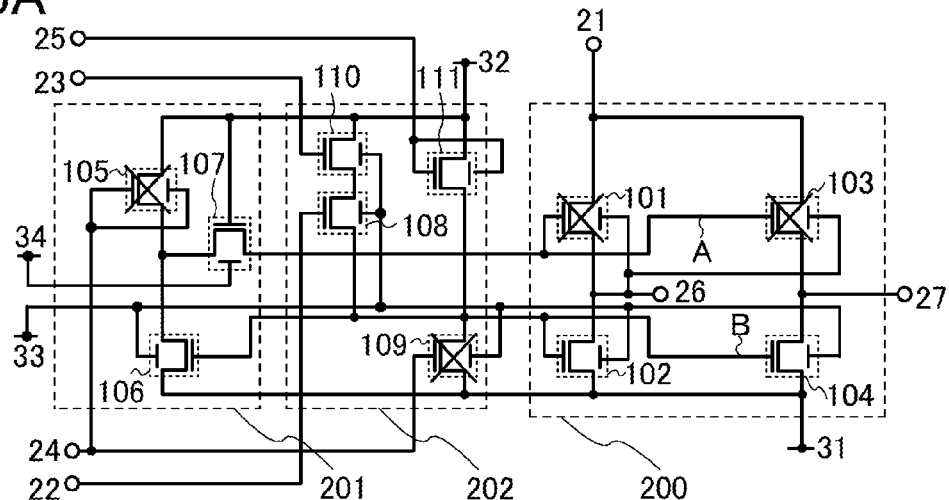
FIGS. 5A to 5C illustrate operation of the pulse signal output circuit.
Figure 5B:
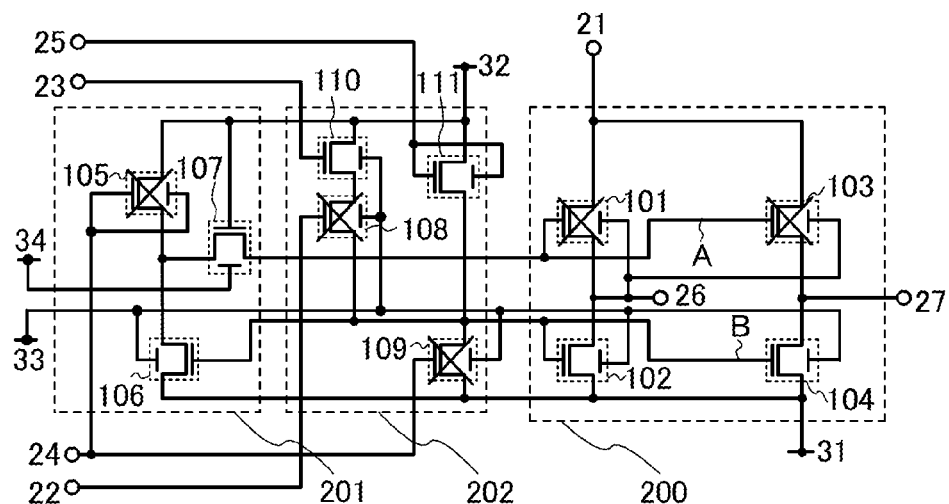
Figure 5C:
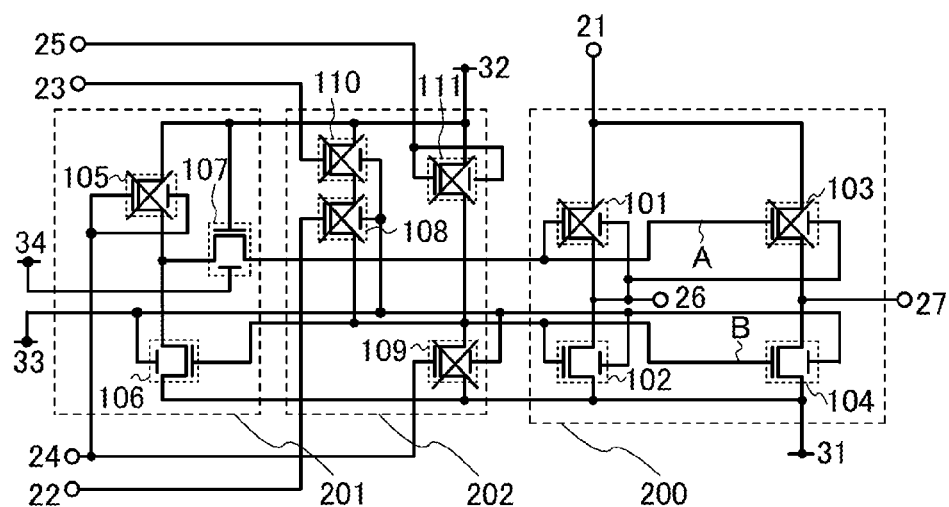

As illustrated in FIG. 1C, each of the first to n-th pulse signal output circuits $10\_1$ to $10\_n$ includes a pulse signal generation circuit 200 including transistors 101 to 104; a first input signal generation circuit 201 including transistors 105 to 107; and a second input signal generation circuit 202 including transistors 108 to 111.

The transistors 101 to 111 each include a first gate terminal, a second gate terminal, a first terminal (drain terminal), and a second terminal (source terminal). The first gate terminal and the second gate terminal are provided with insulating films sandwiching a semiconductor film provided therebetween. The first terminal and the second terminal are provided in contact with the semiconductor film.

The transistors 101 to 111 preferably each include an oxide semiconductor in semiconductor films. When an oxide semiconductor is included in the transistor, the off-state current of the transistor can be reduced. Further, the on-state current and field-effect mobility can be increased as compared with those in the case where amorphous silicon or the like is used. Furthermore, the deterioration of the transistor can be prevented. Thus, an electronic circuit which consumes low power, can operate at high speed, and operates with higher accuracy is achieved. Note that the description of the transistor including an oxide semiconductor is omitted here because it is described in detail in an embodiment below.

A configuration of a pulse signal output circuit illustrated in FIG. 1C is described.

The first terminal of the transistor 101 is connected to the input terminal 21. The second terminal of the transistor 101 is connected to the output terminal 26. The first gate terminal of the transistor 101 is connected to the second terminal of the transistor 107. The second gate terminal of the transistor 101 is connected to the output terminal 26.

The first terminal of the transistor 102 is connected to the output terminal 26. The second terminal of the transistor 102 is connected to the power supply line 31. The first gate terminal of the transistor 102 is connected to the second terminal of the transistor 108. The second gate terminal of the transistor 102 is connected to the power supply line 33.

The first terminal of the transistor 103 is connected to the input terminal 21. The second terminal of the transistor 103 is connected to the output terminal 27. The first gate terminal of the transistor 103 is connected to the second terminal of the transistor 107. The second gate terminal of the transistor 103 is connected to the output terminal 26.

The first terminal of the transistor 104 is connected to the output terminal 27. The second terminal of the transistor 104 is connected to the power supply line 31. The first gate terminal of the transistor 104 is connected to the second terminal of the transistor 108. The second gate terminal of the transistor 104 is connected to the power supply line 33.

The first terminal of the transistor 105 is connected to the power supply line 32. The second terminal of the transistor 105 is connected to the first terminal of the transistor 106 and the first terminal of the transistor 107. The first gate terminal and the second gate terminal of the transistor 105 are connected to the input terminal 24.

The first terminal of the transistor 106 is connected to the second terminal of the transistor 105 and the first terminal of the transistor 107. The second terminal of the transistor 106 is connected to the power supply line 31. The first gate terminal of the transistor 106 is connected to the second terminal of the transistor 108. The second gate terminal of the transistor 106 is connected to the power supply line 33.

The first terminal of the transistor 107 is connected to the second terminal of the transistor 105 and the first terminal of the transistor 106. The second terminal of the transistor 107 is connected to the first gate terminal of the transistor 101 and the first gate terminal of the transistor 103. The first gate terminal of the transistor 107 is connected to the power supply line 32. The second gate terminal of the transistor 107 is connected to the power supply line 34.

The first terminal of the transistor 108 is connected to the second terminal of the transistor 110. The second terminal of the transistor 108 is connected to the first gate terminal of the transistor 102, the first gate terminal of the transistor 104, and the first gate terminal of the transistor 106. The first gate terminal of the transistor 108 is connected to the input terminal 22. The second gate terminal of the transistor 108 is connected to the power supply line 33.

The first terminal of the transistor 109 is connected to the second terminal of the transistor 108. The second terminal of the transistor 109 is connected to the power supply line 31. The first gate terminal of the transistor 109 is connected to the input terminal 24. The second gate terminal of the transistor 109 is connected to the power supply line 33.

The first terminal of the transistor 110 is connected to the power supply line 32. The second terminal of the transistor 110 is connected to the first terminal of the transistor 108. The first gate terminal of the transistor 110 is connected to the input terminal 23. The second gate terminal of the transistor 110 is connected to the power supply line 33.

The first terminal of the transistor 111 is connected to the power supply line 32. The second terminal of the transistor 111 is connected to the second terminal of the transistor 108. The first gate terminal and the second gate terminal of the transistor 111 are connected to the input terminal 25.

Note that components of the pulse signal output circuit (e.g., the pulse signal generation circuit 200, the first input signal generation circuit 201, and the second input signal generation circuit 202) are just examples, and one embodiment of the present invention is not limited thereto.

In the case where the pulse signal output circuit illustrated in FIG. 1C is the first pulse signal output circuit $10_{\_1}$ illustrated in FIG. 1A, the clock signal CLK1, the clock signal CLK2, the clock signal CLK3, the start pulse SP1, and an output signal of the third pulse signal output circuit $10_{\_3}$ (denoted by SROUT3) are input to the input terminal 21, the input terminal 22, the input terminal 23, the input terminal 24, and the input terminal 25, respectively. In addition, an output signal of the first pulse signal output circuit $10_{\_1}$ (denoted by SROUT1) is output from the output terminal 26 to the input terminal 24 in the second pulse signal output circuit $10_{\_2}$. An output signal OUT(1) is output from the output terminal 27. Note that an H-level signal and an L-level signal which are supplied to each input terminal are VDD and VSS, respectively.

Further, VSS, VDD, BG1, and BG2 are supplied to the power supply line 31, the power supply line 32, the power supply line 33, and the power supply line 34, respectively. Note that BG1 is lower than GND (negative potential) and BG2 is higher than or equal to GND.

In the following description of this embodiment, in the pulse signal output circuit illustrated in FIG. 1C, a connection portion of the first gate terminal of the transistor 101, the first gate terminal of the transistor 103, and the second terminal of the transistor 107 is a node A. Further, a connection portion of the first gate terminal of the transistor 102, the first gate terminal of the transistor 104, the first gate terminal of the transistor 106, the second terminal of the transistor 108, the first terminal of the transistor 109, and the second terminal of the transistor 111 is a node B.

A capacitor for favorably performing bootstrap operation may be provided between the node A and the output terminal 26. Further, a capacitor electrically connected to the node B may be provided in order to hold the potential of the node B.

In FIG. 1C, the ratio W/L of the channel width W to the channel length L of the transistor 101 and the ratio W/L of the channel width W to the channel length L of the transistor 103 are each preferably larger than the ratio W/L of the channel width W to the channel length L of the transistor 106.

In FIG. 1C, the ratio W/L of the channel width W to the channel length L of the transistor 105 is preferably larger than the ratio W/L of the channel width W to the channel length L of the transistor 106. The ratio W/L of the channel width W to the channel length L of the transistor 105 is preferably equal to the ratio W/L of the channel width W to the channel length L of the transistor 107. Alternatively, the ratio W/L of the channel width W to the channel length L of the transistor 105 is preferably larger than the ratio W/L of the channel width W to the channel length L of the transistor 107.

In FIG. 1C, the ratio W/L of the channel width W to the channel length L of the transistor 103 is preferably larger than the ratio W/L of the channel width W to the channel length L of the transistor 104.

In FIG. 1C, the channel width W of the transistor 108 and the channel width W of the transistor 110 are each preferably smaller than the channel width W of the transistor 111.

The operations of the transistor 101 and the transistor 103 affect the signal SROUT1 output from the output terminal 26 and the signal OUT(1) output from the output terminal 27.

Accordingly, the second gate terminal of the transistor 101 and the second gate terminal of the transistor 103 are connected to the output terminal 26 as illustrated in FIG. 1C.

Thus, when the transistor 101 and the transistor 103 are in an on state, the threshold voltages shift in the negative direction; accordingly, the transistors function as normally-on transistors. As a result, on-state current is increased. In addition, when the transistor 101 and the transistor 103 are in an off state, the threshold voltages shift in the positive direction; accordingly, the transistors function as normally-off transistors. As a result, leakage current is decreased.

In addition, since current can be increased when the transistor 101 and the transistor 103 are in an on state, the channel widths W of the transistor 101 and the transistor 103 can be low in comparison with the case where the transistors do not include second gate terminals. Thus, layout area and power consumption can be reduced.

The transistor 102, the transistor 104, the transistor 108, the transistor 109, and the transistor 110 control the potential of the node B. Accordingly, when the threshold voltages of these transistors are changed and leakage current is generated, the transistors cannot control the potential of the node B.

In view of the above problem, as illustrated in FIG. 1C, the second gate terminal of the transistor 102, the second gate terminal of the transistor 104, the second gate terminal of the transistor 108, the second gate terminal of the transistor 109, and the second gate terminal of the transistor 110 are connected to the power supply line 33 supplying a negative potential. Thus, since the transistors in an off state can definitely function as normally-off transistors, leakage current can be reduced.

Further, the operation of the transistor 105 affects the operations of the transistor 101 and the transistor 103. The operation of the transistor 111 affects the operations of the transistor 102, the transistor 104, and the transistor 106.

Accordingly, as illustrated in FIG. 1C, the second gate terminal of the transistor 105 is connected to the first gate terminal of the transistor 105, and the second gate terminal of the transistor 111 is connected to the first gate terminal of the transistor 111. Thus, when the transistor 105 and the transistor 111 are in an on state, the threshold voltages shift in the negative direction; accordingly, the transistors can be function as normally-on transistors. As a result, on-state current is increased. In addition, when the transistor 105 and the transistor 111 are in an off state, the threshold voltages shift in the positive direction; accordingly, the transistors function as normally-off transistors. As a result, leakage current is decreased.

When the threshold voltage of the transistor 107 is too low (e.g., −10 V), a voltage of $((V_A-Vth_{107})-VSS)$ is applied between the source and the drain of the transistor 106. Note that $V_A$ is the potential of the node A. Therefore, the load of the transistor 106 might be large.

In view of the above problem, the second gate terminal of the transistor 107 is connected to the power supply line 34, whereby a potential of BG2 which is lower than or equal to GND is supplied to the second gate terminal of the transistor 107. Thus, the threshold voltage of the transistor 107 can be controlled to be approximately 0 V; therefore, the load of the transistor 106 can be prevented from being large.

<Operation>

Next, the operation of the shift register illustrated in FIGS. 1A to 1C is described with reference to FIG. 2, FIG. 3, FIGS. 4A to 4C, and FIGS. 5A to 5C. Specifically, operation in each of first to sixth periods 51 to 56 in a timing chart in FIG. 2 is described with reference to FIGS. 4A to 4C and FIGS. 5A to 5C. Note that in a timing chart in FIG. 3, part of the periods shown in FIG. 2 is exaggerated; for example, the fourth period 54 is divided into five periods (periods 54_1 to 54_5). However, this timing chart is not largely different from the timing chart in FIG. 2. In the timing charts illustrated in FIG. 2 and FIG. 3, CLK1 to CLK4 denote clock signals; SP1 denotes a first start pulse; OUT(1) to OUT(4) denote outputs from the output terminals 27 in the first to fourth pulse signal output circuits 10_1 to 10_4; node A and node B denote respective potentials at the node A and the node B; and SROUT1 to SROUT4 denote outputs from the output terminals 26 in the first to fourth pulse signal output circuits 10_1 to 10_4.

Note that in the following description, the transistors 101 to 111 are all n-channel transistors. In FIGS. 4A to 4C and FIGS. 5A to 5C, a transistor marked with a cross is the transistor in a non-conduction state (off state) and a transistor not marked with a cross is the transistor in a conduction state (on state).

Typically, the operation of the first pulse signal output circuit 10_1 is described. The configuration of the first pulse signal output circuit 10_1 is as illustrated in FIG. 1C. The relation among input signals and supplied potentials is also as illustrated in FIG. 1C.

In the first period 51, an H-level signal is input to the input terminal 24 as SP1, whereby VDD is supplied to the first gate terminal of the transistor 105, the second gate terminal of the transistor 105, and the first gate terminal of the transistor 109; accordingly, the transistor 105 and the transistor 109 are turned on. Further, an H-level signal is input to the input terminal 23 as CLK3, whereby VDD is supplied to the first gate terminal of the transistor 110; accordingly, the transistor 110 is also turned on. Furthermore, VDD is supplied from the power supply line 32 to the first gate terminal of the transistor 107; accordingly, the transistor 107 is also turned on. In addition, BG1 (e.g., a negative potential) is supplied from the power supply line 33 to the second gate terminal of the transistor 109 and the second gate terminal of the transistor 110, and BG2 (e.g., GND) is supplied from the power supply line 34 to the second gate terminal of the transistor 107 (see FIG. 4A). At that time, an H-level signal is input to the second gate terminal of the transistor 105, whereby the threshold voltage of the transistor 105 shifts in the negative direction and thus the transistor 105 can function as a normally-on transistor because; therefore, on-state current can be increased.

When the transistor 105 and the transistor 107 are turned on, the potential of the node A is increased. When the transistor 109 is turned on, the potential of the node B is decreased. The potential of the first terminal of the transistor 105 is VDD, and therefore, the potential of the second terminal of the transistor 105 is the value (VDD−$Vth_{105}$), in which the threshold voltage of the transistor 105 is subtracted from the potential of the first terminal. Since the potential of the first gate terminal of the transistor 107 is VDD, the potential of the node A is (VDD−$Vth_{107}$) when $Vth_{107}$ which is the threshold voltage of the transistor 107 is equal to or higher than $Vth_{105}$, whereby the transistor 107 is turned off. On the other hand, when $Vth_{107}$ is lower than $Vth_{105}$, the potential of the node A rises to VDD−$Vth_{105}$ while the transistor 107 is kept on. Hereinafter, a mark (the highest potential) of the node A in the first period 51 is denoted by $V_{AH}$.

When the potential of the node A is $V_{AH}$, the potential $V_{AH}$ is input to the first gate terminal of the transistor 101 and the first gate terminal of the transistor 103, the transistor 101 and the transistor 103 are turned on. Here, an L-level signal is input to the input terminal 21 as CLK1, whereby VSS is output from the output terminal 26 and the output terminal 27 as SROUT1 and OUT(1), respectively.

In the second period 52, an H-level signal is input to the input terminal 21 as CLK1. Since the transistor 101 and the transistor 103 are in an on state, the potential of the output terminal 26 and the potential of the output terminal 27 are increased. Accordingly, the potentials input to the second gate terminal of the transistor 101 and the second gate terminal of the transistor 103 are also increased. Further, capacitance is generated between the first gate terminal of the transistor 101 and the second terminal of the transistor 101, whereby the first gate terminal and the second terminal are capacitively coupled. Similarly, capacitance is generated between the first gate terminal of the transistor 103 and the second terminal of the transistor 103, whereby the first gate terminal and the second terminal are capacitively coupled. Thus, the potential of the node A in a floating state is increased as the potential of the output terminal 26 and the potential of the output terminal 27 are increased (bootstrap operation). As a result, the potential of the node A becomes higher than VDD+Vth$_{101}$, and VDD is output from the output terminal 26 and the output terminal 27 as SROUT1 and OUT(1), respectively (see FIG. 4B). At that time, the second gate terminal of the transistor 101 and the second gate terminal of the transistor 103 are connected to the output terminal 26, and therefore, VDD is supplied to the second gate terminal of the transistor 101 and the second gate terminal of the transistor 103.

Here, current is defined by the following formula. Salutation characteristics and liner characteristics are expressed by Formula 1 and Formula 2, respectively.

$$I=(\tfrac{1}{2})\beta(Vg-Vth)^2 \qquad \text{(Formula 1)}$$

$$I=\beta((Vg-Vth)-\tfrac{1}{2}Vd)Vd \qquad \text{(Formula 2)}$$

As expressed by Formula 1 and Formula 2, current is proportional to $(Vg-Vth)^2$ or $(Vg-Vth)$. Formula 1 and Formula 2 show that $(Vg-Vth)$ is increased by negative shifts of the threshold voltages of the transistor 101 and the transistor 103, whereby the current is increased.

Therefore, by controlling the threshold voltages of the transistor 101 and the transistor 103, current can be increased when the transistor 101 and the transistor 103 are in an on state. Thus, time required for charging the output terminal 27 can be shorter. Further, layout area and power consumption can be reduced.

In the second period 52, the transistor 109 is in an on state; therefore, the node B is kept at VSS. Thus, variation in the potential of the node B due to capacitive coupling, which occurs when the potential of the output terminal 26 is changed from VSS to VDD, can be suppressed, so that a malfunction due to the variation in the potential can be prevented.

As described above, in the second period 52, in the case where the potential of the output terminal 27 is at VDD, a gate voltage (Vg) of the transistor 103 needs to be sufficiently high for turning on the transistor 103 in order to definitely increase the potential of the output terminal 27 to VDD. In the case where the gate voltage Vg of the transistor 103 is low, a drain current of the transistor 103 is small, so that it takes a long time to increase the potential of the output terminal 27 to VDD in the specified period (here, in the second period 52). Accordingly, a rising edge of a waveform of the potential of the output terminal 27 becomes rounded, which leads to a malfunction.

Note that the level of the gate voltage Vg of the transistor 103 in the second period 52 depends on the potential of the node A in the first period 51. Therefore, in order to increase the gate voltage Vg of the transistor 103, the potential of the node A should be as high as possible in the first period 51 (the maximum value is VDD-Vth$_{105}$ or VDD-Vth$_{107}$ in consideration of the circuit design). The same can be said also for the output terminal 26 and the gate voltage Vg of the transistor 101.

Therefore, the ratio W/L of the channel width W to the channel length L of the transistor 105 is preferably larger than the ratio W/L of the channel width W to the channel length L of the transistor 106. When the ratio W/L of the channel width W to the channel length L of the transistor 105 is larger than the ratio W/L of the channel width W to the channel length L of the transistor 106, the potential of the node A in the first period 51 can be increased to VDD-Vth$_{105}$ or VDD-Vth$_{107}$ in a shorter time. Note that in the first period 51, the transistor 106 is in an off state. When the ratio W/L of the channel width W to the channel length L of the transistor 105 is made larger than the ratio W/L of the channel width W to the channel length L of the transistor 106, leakage current (Ioff) in the transistor 106 can be small, and thus the potential of the node A can be increased to VDD-Vth$_{105}$ in a shorter time.

When the channel length L becomes short due to miniaturization of the transistor, the threshold voltage shifts to the negative direction and the transistor 106 functions as a normally-on transistor in some cases. Even in such a case, when the ratio W/L of the channel width W to the channel length L of the transistor 106 is made smaller than the ratio W/L of the channel width W to the channel length L of the transistor 105, the on resistance of the transistor 106 can be larger than the on resistance of the transistor 105. Accordingly, the potential of the node A can be made to be a potential close to VDD-Vth$_{105}$ or VDD-Vth$_{107}$.

The ratio W/L of the channel width W to the channel length L of the transistor 105 is preferably almost equal to the ratio W/L of the channel width W to the channel length L of the transistor 107. The expression "almost equal" can be used in the case where it would be understood that two objects had the same value in consideration of a slight difference due to an error in manufacturing or variation. When the ratio W/L of the channel width W to the channel length L of the transistor 105 and the ratio W/L of the channel width W to the channel length L of the transistor 107 are equal to each other, the current supply capability of the transistor 105 and that of the transistor 107 can be equal to each other; thus, the potential of the node A can be efficiently increased. As described above, the threshold voltage Vth$_{105}$ of the transistor 105 and Vth$_{107}$ of the transistor 107 are preferably almost equal to each other.

Note that the ratio W/L of the channel width W to the channel length L of the transistor 105 can be determined in consideration of the transistor characteristics, the clock frequency, the gate capacitance of the transistor 101, the gate capacitance of the transistor 103, the operating voltage of the shift register, or the like.

When the channel width W of the transistor 106 is large, leakage current is increased in the case where the transistor 106 functions as a normally-on transistor; accordingly, the potential of the node A is decreased. Further, charge of the node A by the transistor 105 is prevented. In the case where high-speed operation is required, the potential of the node B needs to be decreased in a short time in order to charge the node A in a short time. In such a case, the potential of the transistor 106 needs to be decreased in a short time.

Therefore, when the channel width W of the transistor 106 is smaller than that of the transistor 105, the leakage current of the transistor 106 can be reduced and a change in potential of the node A can be prevented. Further, a load of the node B can be reduced. In such a manner, the sizes of the transistor 105, the transistor 106, and the transistor 107 are determined in consideration of the transistor characteristics and the driving specification, whereby a shift register with high efficiency can be obtained.

In addition, as described above, BG2 is supplied from the power supply line 34 to the second gate terminal of the transistor 107. Thus, the threshold voltage of the transistor 107 can be controlled to be approximately 0 V; therefore, the load of the transistor 106 can be prevented from being large even when a voltage of $((V_A-Vth_{107})-VSS)$ is applied between the source and the drain of the transistor 106. Note that $V_A$ is the potential of the node A.

In the third period 53, an L-level signal is input to the input terminal 24 as SP1, whereby VSS is supplied to the first gate terminal of the transistor 105, the second gate terminal of the transistor 105, and the first gate terminal of the transistor 109; accordingly, the transistor 105 and the transistor 109 are turned off. Further, CLK1 input to the input terminal 21 is kept at an H-level signal and the potential of the node A is not changed, and therefore, VDD is output from the output terminal 26 and the output terminal 27 as SROUT1 and OUT(1), respectively (see FIG. 4C). Note that in the third period 53, although the node B is in a floating state, the potential of the output terminal 26 is not changed; therefore, a malfunction due to the capacitive coupling is negligible.

In the fourth period 54, an H-level signal is input to the input terminal 22 as CLK2 and an H-level signal is input to the input terminal 23 as CLK3, whereby VDD is supplied to the first gate terminal of the transistor 108 and the first gate terminal of the transistor 110; accordingly, the transistor 108 and the transistor 110 are turned on. Further, an H-level signal is input to the input terminal 25 as SROUT3 and VDD is input to the first gate terminal of the transistor 111 and the second gate terminal of the transistor 111, whereby the transistor 111 is turned on. The transistor 111 is turned on, whereby the potential of the node B is charged to $VDD-Vth_{111}$ in a short time. Thus, the transistor 102, the transistor 104, and the transistor 106 are turned on. An L-level signal is input to the input terminal 21 as CLK1, whereby the transistor 101 and the transistor 103 are turned off. As a result, VSS is output from the output terminal 26 and the output terminal 27 as SROUT1 and OUT(1), respectively (see FIG. 5A). Here, an H-level signal is input to the second gate terminal of the transistor 111, whereby the threshold voltage of the transistor 111 shifts in the negative direction and thus the transistor 111 can function as a normally-on transistor; therefore, on-state current can be increased.

At this time, the node B is charged through the transistor 110 and the transistor 108 in addition to the transistor 111. The first gate terminal of the transistor 110 and the first gate terminal of the transistor 108 are connected to the input terminal 23 and the input terminal 22, respectively, and the gate capacitance of the transistor 110 and the gate capacitance of the transistor 108 correspond to the load of the input terminal 23 and the load of the input terminal 22, respectively.

In the fourth period 54, the potential of the node A should be decreased to VSS before CLK1 becomes H-level signal in the sixth period (that is, during the fourth period 54 and the fifth period 55). When the potential of the node A is not decreased to VSS during the fifth period 55, the potential of the node A is increased again because of the capacitive coupling between the gate and the source of the transistor 103; thus, the transistor 101 and the transistor 103 are turned on, and current flows through the output terminal 26 and the output terminal 27, so that a malfunction might occur.

Therefore, a relation among the transistor 101, the transistor 103, and the transistor 106 is determined as the following formulae (1) to (7), whereby the operation malfunction due to a load is reduced and stabilization of the operation can be achieved.

[FORMULA 1]
$$i_{106} = \frac{(C_{101} + C_{103}) \times V_f}{t_{off}} \quad (1)$$

[FORMULA 2]
$$i_{106} = \frac{W_{106}}{2L_{106}} \times \mu \times Cox \times (Vgs_{106} - Vth_{106})^2 \quad (2)$$

[FORMULA 3]
$$\frac{1}{f_{clk}} = T = t_{CKH} + t_{CKL} \quad (3)$$

[FORMULA 4]
$$t_{off} = t_{CKL} - t_\alpha \quad (4)$$

[FORMULA 5]
$$C_{101} = L_{101} \times W_{101} \times Cox \quad (5)$$

[FORMULA 6]
$$C_{103} = L_{103} \times W_{103} \times Cox\left(Cox = \frac{\varepsilon_o \times \varepsilon_r}{tox}\right) \quad (6)$$

[FORMULA 7]
$$V_f = (VDD - Vth_{105}) + VDD \quad (7)$$

In the above formulae, $t_{CKH}$ corresponds to a period during which CLK1 is a H-level signal, that is, the second period 52 and the third period 53; $t_{CKL}$ corresponds to a period during which CLK1 is an L-level signal, that is, the fourth period 54 and the fifth period 55; and $t_{off}$ corresponds to a time required for decreasing the potential of the node A to VSS. That is, in $t_{CKL}$, the potential of the node A is decreased to VSS in $t_{off}$. $t_{off}$ is not particularly limited as long as it is spent in a period from the fourth period 54 through the fifth period 55; for example, $t_{off}$ may be spent in the period 54_1, in a period from the period 54_1 to the period 54_3, or in the period from the period 54_1 to the period 54_5 (see FIG. 3). In particular, the period from the period 54_1 to the period 54_3 corresponding to ½ of the period from the fourth period 54 to the fifth period 55 is preferable. The reason of this is as follows: when $t_{off}$ is set too short with respect to $t_{CKL}$, the channel width W of the transistor 106 needs to be set large in order to decrease the potential of the node A quickly, and in contrast, when $t_{off}$ is set long, the potential of the node A cannot be decreased to VSS by the time a next H-level clock signal is input and a malfunction might occur. That is, $t_{off}$ needs to be determined in consideration of the frequency of the clock signal or the like.

$C_{101}$ and $C_{103}$ denote the gate capacitance of the transistor 101 and the gate capacitance of the transistor 103, respectively. $V_f$ denotes the potential of the node A in the third period 53.

$i_{106}$ in the formula (2) denotes the drain current of the transistor 106. With the use of this, the size (e.g., W/L) of the transistor 106 can be determined. In other words, the size of the transistor 106 can be determined in consideration of the operating frequency of CLK1, the size of the transistor 101, the size of the transistor 103, and the potential of the node A.

For example, in the case where the operating frequency of CLK1 is high, the potential of the node A needs to be decreased quickly; thus, $t_{off}$ should be short as seen from the formula (1). Therefore, $i_{106}$ needs to be large. $W_{106}$ is calculated in accordance with $i_{106}$ from the formula (2) and can be determined.

On the other hand, in the case where the size of the transistor 101 and the size of the transistor 103 are small, $i_{106}$ may be small; thus, $W_{106}$ becomes small from the formula (2). Note that the transistor 103 is used for charge and discharge of an output load. When the size of the transistor 103 is increased, not only the transistor 104 but also the transistor 103 can be discharged at the time of discharge. Accordingly, the output potential can be decreased in a short time. Therefore, when the potential of the node A is gradually decreased, the output potential can be decreased in a short time as compared with that in the case where only the transistor 104 is discharged, because the transistor 103 is in an on state. In such a manner, the size of the transistor 106 is determined in consideration of the transistor characteristics and the driving specification, whereby a shift register with high efficiency can be obtained.

Note that in the shift register described in this embodiment, loads of the transistors connected to a clock line are expressed as "the total number of the stages of the shift register÷4×($L_{ov}$ of the transistor 103+$L_{ov}$ of the transistor 101+the gate capacitance of the transistor 110+the gate capacitance of the transistor 108)". Note that the gate capacitance is expressed as "$\epsilon_0 \times \epsilon \times (L \times W)/tox$". Note that $L_{ov}$ represents the length of a region where a source electrode layer or a drain electrode layer of a transistor overlaps with a semiconductor layer in a channel length direction.

In order to reduce the gate capacitance connected to the clock line, the channel width W of the transistor 108 and the channel width W of the transistor 110 are each preferably smaller than the channel width W of the transistor 111. With such a structure, the load of the clock line can be reduced, whereby the high-speed operation can be achieved. When the channel width W of the transistor 110 and that of the transistor 108 are reduced, layout area can be decreased.

In the fifth period 55, an H-level signal is input to the input terminal 25 as SROUT3, whereby the potential of the node B is kept. Thus, the on states of the transistor 102, the transistor 104, and the transistor 106 are kept and the potentials output from the output terminal 26 and the output terminal 27 as SROUT1 and OUT(1), respectively are kept at VSS (see FIG. 5B).

In the sixth period 56, an L-level signal is input to the input terminal 25 as SROUT3, whereby VSS is input to the first gate terminal of the transistor 111 and the second gate terminal of the transistor 111; accordingly, the transistor 111 is turned off. At this time, the node B is brought into a floating state while keeping its potential. Thus, the on states of the transistor 102, the transistor 104, and the transistor 106 are kept (see FIG. 5C).

Note that the potential of the node B usually falls due to the off-state current of a transistor, for example. In contrast, a transistor with a sufficiently small off-state current (e.g., a transistor including an oxide semiconductor) does not have such a problem. Note that in order to suppress the fall in the potential of the node B, a capacitor may be provided. The capacitor provided in this case is electrically connected to the first gate terminal of the transistor 102, the first gate terminal of the transistor 104, the first gate terminal of the transistor 106, the first terminal of the transistor 108, and the first terminal of the transistor 109.

Note that when CLK2 input to the input terminal 22 and CLK3 input to the input terminal 23 become H-level signals in the subsequent period, VDD is supplied to the first gate terminal of the transistor 108 and the first gate terminal of the transistor 110, whereby the transistor 108 and the transistor 110 are turned on; accordingly, a potential is regularly supplied to the node B. Therefore, even when a transistor having a comparatively large off-state current is used, malfunctions of the pulse signal output circuit can be prevented.

Note that as for the outputs (such as OUT(1) to OUT(4)) from the shift register, there are the case where the time when the potential is increased is valued and the case where the time when the potential is decreased is valued. For example, in the case where data is determined by a potential increase (e.g., when data is written), the time when the potential is increased is valued. In the case where data is determined by a potential decrease, the time when the potential is decreased is valued.

In the case where data is determined by the potential increase, the time required for increasing the potential needs to be short. For that purpose, the ratio W/L of the channel width W to the channel length L of the transistor 103 is preferably larger than the ratio W/L of the channel width W to the channel length L of the transistor 104.

In the case where data is determined by the potential decrease, the time required for decreasing the potential needs to be short. For that purpose, the ratio W/L of the channel width W to the channel length L of the transistor 103 is preferably larger than the ratio W/L of the channel width W to the channel length L of the transistor 104.

Note that in one embodiment of the present invention, the potential of the node A is increased to a predetermined potential by bootstrap operation that utilizes the capacitive coupling between the gate and the source of the transistor 103. Accordingly, the transistor 103 is turned on, and an H-level signal is output. Therefore, when the ratio W/L of the channel width W to the channel length L of the transistor 103 is not sufficiently large, a problem might arise in that an H-level potential output from the shift register is not increased to VDD. Thus, it is preferable that the ratio W/L of the channel width W to the channel length L of the transistor 103 be sufficiently large.

In one embodiment of the present invention, the second gate terminal of the transistor 101 and the second gate terminal of the transistor 103 are connected to the output terminal 26. Thus, when the transistor 101 and the transistor 103 are in an on state, the threshold voltages shift in the negative direction; accordingly, the transistors function as normally-on transistors. As a result, on-state current is increased. In addition, when the transistor 101 and the transistor 103 are in an off state, the threshold voltages shift in the positive direction; accordingly, the transistors function as normally-on transistors. As a result, leakage current can be decreased. Thus, in comparison with the case where the transistors do not have second gate terminals, the channel widths W of the transistor 101 and the transistor 103 can be small; accordingly, layout area and power consumption can be reduced.

Further, in one embodiment of the present invention, the second gate terminal of the transistor 102, the second gate terminal of the transistor 104, the second gate terminal of the transistor 108, the second gate terminal of the transistor 109, and the second gate terminal of the transistor 110 are connected to the power supply line 33 supplying a negative potential. Thus, since the transistors in an off state can definitely function as normally-off transistors, leakage current can be reduced.

In one embodiment of the present invention, the second gate terminal of the transistor 105 is connected to the first gate terminal of the transistor 105, and the second gate terminal of the transistor 111 is connected to the first gate terminal of the transistor 111. Thus, when the transistor 105 and the transistor 111 are in an on state, the threshold voltages shift in the negative direction; accordingly, the transistors function as normally-on transistors. As a result, on-state current is increased. In addition, when the transistor 105 and the transistor 111 are in an off state, the threshold voltages shift in the positive direction; accordingly, the transistors can function as normally-off transistors. As a result, leakage current can be decreased.

In addition, in one embodiment of the present invention, the second gate terminal of the transistor 107 is connected to the power supply line 34. Thus, the threshold voltage of the transistor 107 can be controlled to be approximately 0 V; therefore, the load of the transistor 106 can be prevented from being large even when a voltage of $((V_A-Vth_{107})-VSS)$ is applied between the source and the drain of the transistor 106. Note that $V_A$ is the potential of the node A.

According to one embodiment of the present invention, even when the threshold voltages of the plurality of transistors included in the pulse signal output circuit are varied, the threshold voltage of each transistor can be controlled. Further, even when the degrees of variations of the threshold voltages of transistors are different, the threshold voltage of each transistor can be controlled regardless of degree of variation of the threshold voltage.

With the structure, by reducing leakage current and preventing malfunction, a pulse signal output circuit which can stably operate with low power consumption can be formed.

Note that, the shift register of this embodiment is driven by a driving method in which a pulse output from the m-th pulse signal output circuit overlaps with half of a pulse output from the (m+1)th pulse signal output circuit. Therefore, a wiring can be charged for a longer period of time as compared to the case where the driving method is not used. That is to say, with the driving method, a pulse signal output circuit which withstands a heavy load and operates at high frequency is provided.

Figure 6A:
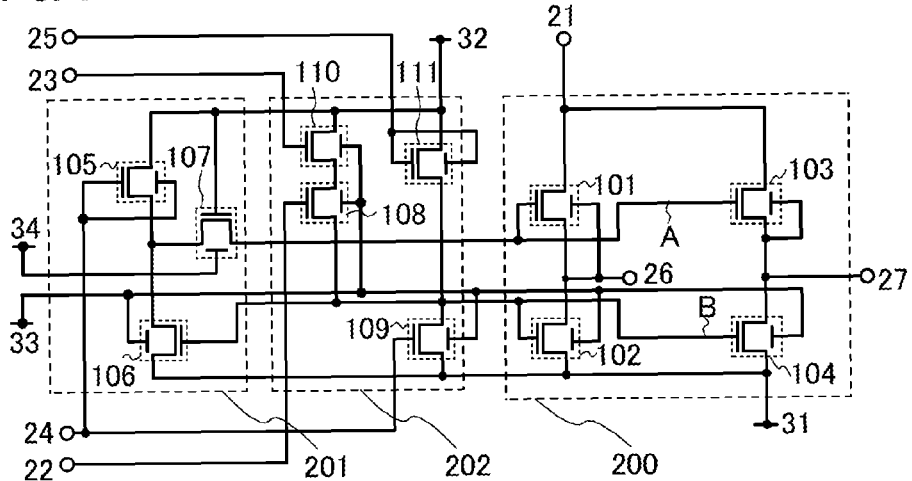
FIGS. 6A to 6C illustrate configuration examples of a pulse signal output circuit.
Figure 6B:
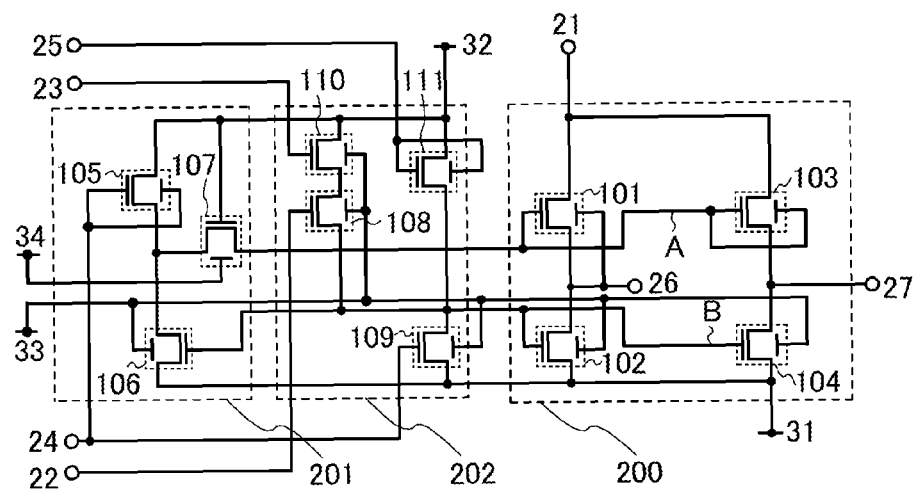
Figure 6C:
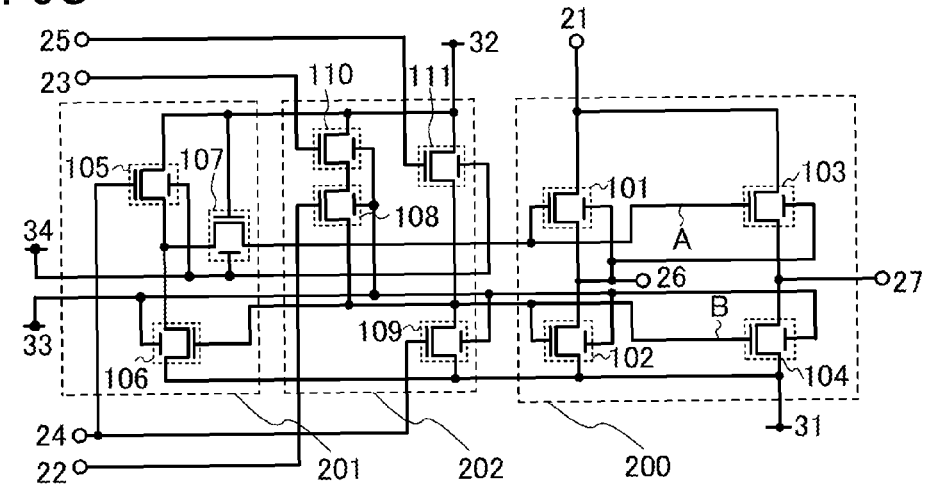

FIGS. 6A to 6C each illustrate a pulse signal output circuit which is partly different from the pulse signal output circuit illustrated in FIG. 1C.

In the pulse signal output circuit illustrated in FIG. 6A, the second gate terminal of the transistor 103 is connected to the output terminal 27. Such a configuration can achieve easier connection in comparison with the case of connecting the second gate terminal of the transistor 103 and the output terminal 26.

In the pulse signal output circuit illustrated in FIG. 6B, the second gate terminal of the transistor 103 is connected to the second terminal of the transistor 107. With such a configuration, the threshold voltage of the transistor 103 shifts in the negative direction when the transistor 103 is in an on state, whereby the transistor 103 can function as a normally-on transistor. Therefore, on-state current can be increased.

In the pulse signal output circuit illustrated in FIG. 6C, the second gate terminal of the transistor 105, the second gate terminal of the transistor 107, and the second gate terminal of the transistor 111 are connected to the power supply line 34. Thus, the threshold voltages of the transistor 105 and the transistor 107 can be approximately equal to each other. Further, a potential of GND≤BG2 is input from the power supply line 34 to the second terminal of the transistor 107, whereby the threshold voltage of the transistor 107 shifts in the negative direction. Accordingly, the transistor 107 functions as a normally-on transistor and on-state current is increased. As a result, frequency characteristics can be improved.

Alternatively, the second gate terminal of the transistor 105 and the second gate terminal of the transistor 111 may be connected to the power supply line 33. With such a configuration, the threshold voltages of the transistor 105 and the transistor 111 shift in the positive direction when the transistor 105 and the transistor 111 are in an off state, whereby the transistor 105 and the transistor 111 can function as normally-off transistors. Therefore, leakage current can be reduced.

Each of the pulse signal output circuits illustrated in FIGS. 6A to 6C can be used as the pulse signal output circuit illustrated in FIG. 1C. The plurality of pulse signal output circuits illustrated in FIGS. 6A to 6C may be used in combination to form the shift register illustrated in FIG. 1A.

Embodiment 2

In this embodiment, configuration examples of a pulse signal output circuit and a shift register which are different modes from the pulse signal output circuit and the shift register described in the above embodiment and operation thereof are described with reference to FIGS. 7A to 7C, FIG. 8, FIGS. 9A to 9C, and FIGS. 10A and 10B.
<Circuit Configuration>

First, configuration examples of a pulse signal output circuit and a shift register including the pulse signal output circuit are described with reference to FIGS. 7A to 7C.

The configuration of the shift register described in this embodiment is similar to that of the shift register described in the above embodiment. One of differences between them is that the input terminal 23 is not provided in the first to n-th pulse signal output circuits $10_{-1}$ to $10_{-n}$ (see FIGS. 7A to 7C). That is, two types of clock signals are input to one pulse signal output circuit. The other configurations are similar to those in the above embodiment.

Figure 7A:
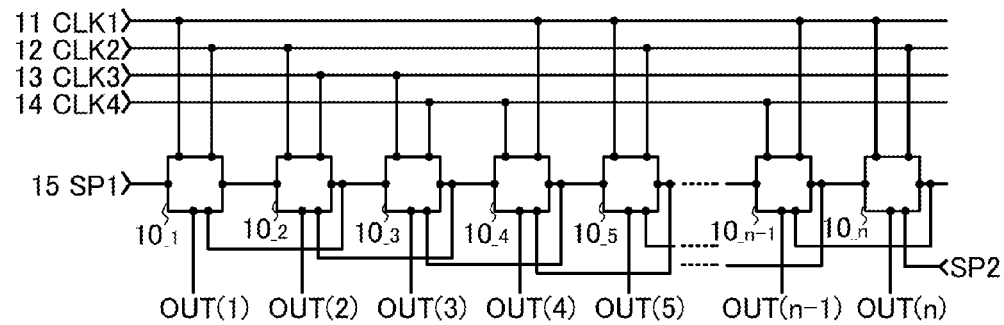
FIGS. 7A to 7C illustrate configuration examples of a pulse signal output circuit and a shift register.
Figure 7B:
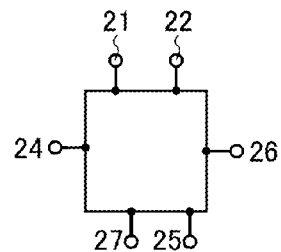
Figure 7C:
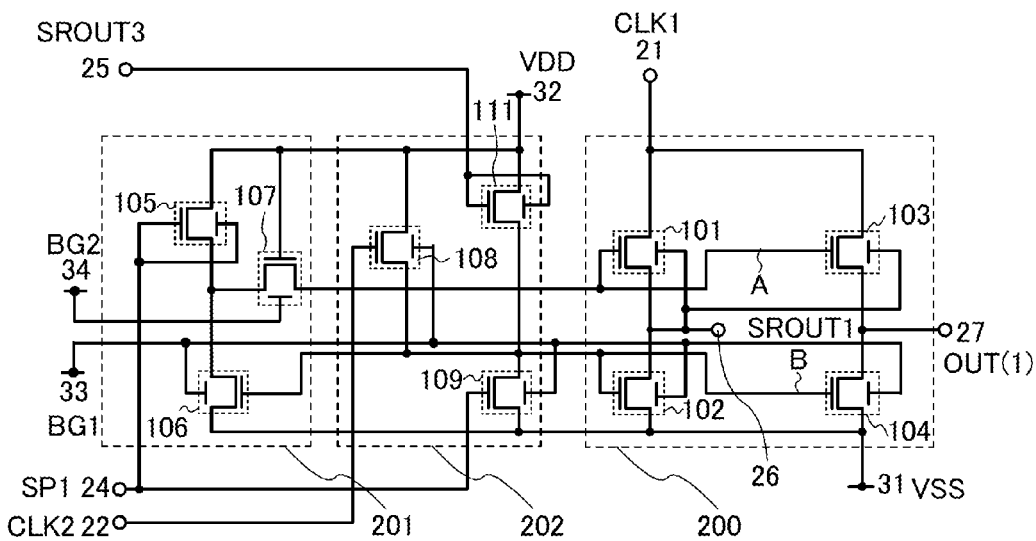
Figure 9A:
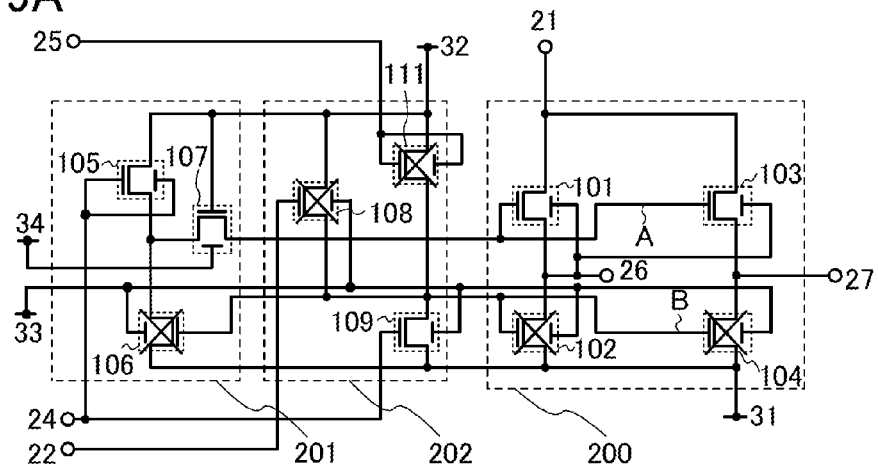
FIGS. 9A to 9C illustrate operation of a pulse signal output circuit.
Figure 9B:
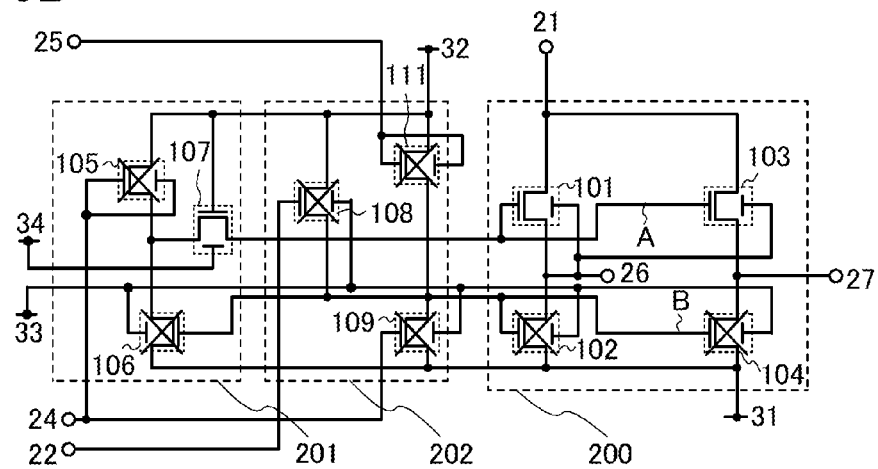
Figure 9C:
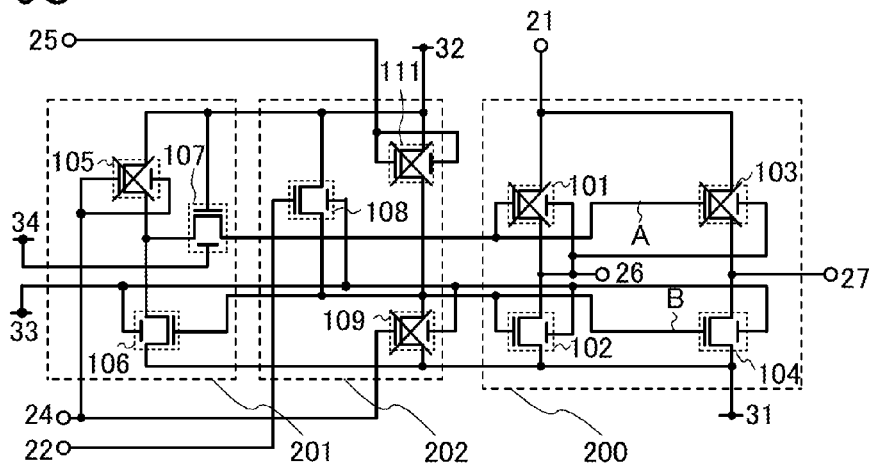
Figure 10A:
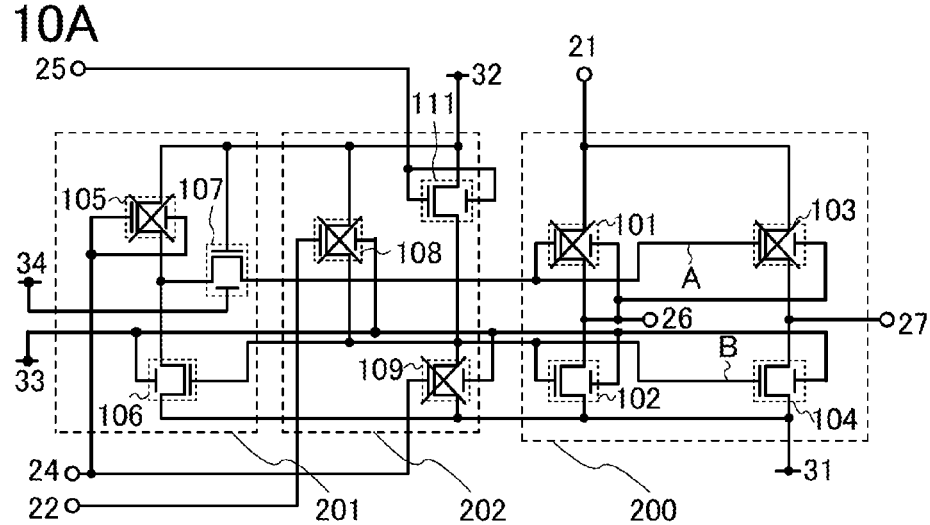
FIGS. 10A and 10B illustrate operation of the pulse signal output circuit.
Figure 10B:
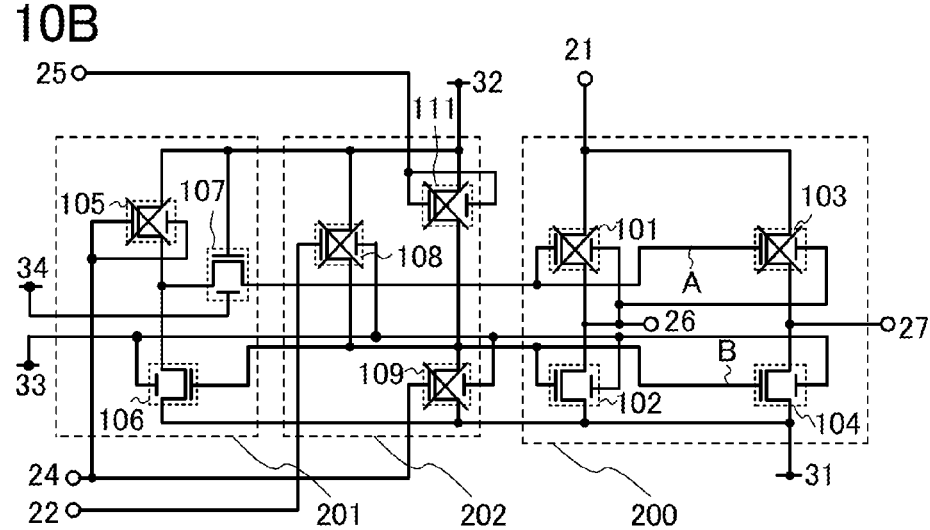

The first to n-th pulse signal output circuits $10_{-1}$ to $10_{-n}$ do not include the input terminal 23 as illustrated in FIG. 7C, and therefore, do not include the transistor 110 connected to the input terminal 23. Accordingly, the connection relation of the second input signal generation circuit 202 in FIG. 1C and the connection relation of a second input signal generation circuit 203 in FIG. 7C are partly different from each other.

The pulse signal output circuit illustrated in FIG. 7C includes the pulse signal generation circuit 200 provided with the transistors 101 to 104, the first input signal generation circuit 201 provided with the transistors 105 to 107, and the second input signal generation circuit 202 provided with the transistor 108, the transistor 109, and the transistor 111.

The transistors 101 to 109 and the transistor 111 each include a first gate terminal, a second gate terminal, a first terminal (drain terminal), and a second terminal (source terminal). The first gate terminal and the second gate terminal are provided with insulating films sandwiching a semiconductor film provided therebetween. The first terminal and the second terminal are provided in contact with the semiconductor film.

The transistors 101 to 109 and the transistor 111 preferably include an oxide semiconductor in semiconductor films. When an oxide semiconductor is included in the transistor, the off-state current of the transistor can be reduced. Further, the on-state current and field-effect mobility can be increased as compared with those in the case where amorphous silicon or the like is used. Furthermore, the deterioration of the transistor can be prevented. Thus, an electronic circuit which consumes low power, can operate at high speed, and operates with higher accuracy is achieved. Note that the description of the transistor including an oxide semiconductor is omitted here because it is described in detail in an embodiment below.

The configuration of the pulse signal output circuit illustrated in FIG. 7C is described. A difference between the configuration shown in FIG. 7C and that shown in FIG. 1C is a connection relation with the transistor 108. Note that the first input signal generation circuit 201 and the pulse signal generation circuit 200 have the similar configuration to that in FIG. 1C, and therefore, detailed description is omitted.

The first terminal of the transistor 108 is connected to the power supply line 32. The second terminal of the transistor 108 is connected to the first gate terminal of the transistor 102, the first gate terminal of the transistor 104, and the first gate terminal of the transistor 106. The first gate terminal of the transistor 108 is connected to the input terminal 22. The second gate terminal of the transistor 108 is connected to the power supply line 33.

In the case where the pulse signal output circuit illustrated in FIG. 7C is the first pulse signal output circuit $10_{-1}$ illustrated in FIG. 7A, the clock signal CLK1, the clock signal CLK2, the start pulse SP1, and an output signal of the third pulse signal output circuit $10_{-3}$ (denoted by SROUT3) are input to the input terminal 21, the input terminal 22, the input terminal 24, and the input terminal 25, respectively. In addition, an output signal of the first pulse signal output circuit $10_{-1}$ (denoted by SROUT1) is output from the output terminal 26 to the input terminal 24 of the second pulse signal output circuit $10_{-2}$. An output signal OUT(1) is output from the output terminal 27. Note that an H-level signal and an L-level signal which are supplied to each input terminal are VDD and VSS, respectively.

Further, VDD, VSS, BG1, and BG2 are supplied to the power supply line 31, the power supply line 32, the power supply line 33, and the power supply line 34. Note that BG1 is GND>BG1 (negative potential) and BG2 is GND≤BG2.

In the following description of this embodiment, similarly to the above embodiment, in the pulse signal output circuit illustrated in FIG. 7C, a connection portion of the first gate terminal of the transistor 101, the first gate terminal of the transistor 103, and the second terminal of the transistor 107 is a node A. Further, a connection portion of the first gate terminal of the transistor 102, the first gate terminal of the transistor 104, the first gate terminal of the transistor 106, the first terminal of the transistor 109, and the second terminal of the transistor 111 is a node B.

A capacitor for favorably performing bootstrap operation may be provided between the node A and the output terminal 26. Further, a capacitor electrically connected to the node B may be provided in order to hold the potential of the node B.

<Operation>

Next, the operation of the shift register illustrated in FIGS. 7A to 7C is described with reference to FIG. 8, FIGS. 9A to 9C, and FIGS. 10A and 10B. Specifically, operation in each of first to fifth periods 51 to 55 in the timing chart in FIG. 2 is described with reference to FIGS. 9A to 9C and FIGS. 10A and 10B. In the timing chart in FIG. 8, CLK1 to CLK4 denote clock signals; SP1 denotes a first start pulse; OUT(1) to OUT(4) denote outputs from the output terminals 27 in the first to fourth pulse signal output circuits $10_{-1}$ to $10_{-4}$; node A and node B denote potentials of the node A and the node B; and SROUT1 to SROUT4 denote outputs from the output terminals 26 in the first to fourth pulse signal output circuits $10_{-1}$ to $10_{-4}$.

Note that in the following description, the transistors 101 to 109 and the transistor 111 are all n-channel transistors. In FIGS. 9A to 9C and FIGS. 10A and 10B, a transistor marked with a cross is the transistor in a non-conduction state (off state). A transistor not marked with a cross is the transistor in a conduction state (on state).

Typically, the operation of the first pulse signal output circuit $10_{-1}$ is described. The configuration of the first pulse signal output circuit $10_{-1}$ is as illustrated in FIG. 7C. The relation among input signals and supplied potentials is also as illustrated in FIG. 7C.

In the first period 51, an H-level signal is input to the input terminal 24 as SP1, whereby VDD is supplied to the first gate terminal of the transistor 105, the second gate terminal of the transistor 105, and the first gate terminal of the transistor 109; accordingly, the transistor 105 and the transistor 109 are turned on. Furthermore, VDD is supplied from the power supply line 32 to the first gate terminal of the transistor 107; accordingly, the transistor 107 is also turned on. In addition, BG1 (e.g., a negative potential) is supplied from the power supply line 33 to the second gate terminal of the transistor 109, and BG2 (e.g., GND) is supplied from the power supply line 34 to the second gate terminal of the transistor 107 (see FIG. 9A). At that time, an H-level signal is input to the second gate terminal of the transistor 105, whereby the threshold voltage of the transistor 105 shifts in the negative direction and then the transistor 105 can function as a normally-on transistor; therefore, on-state current can be increased.

Note that, as described above, BG2 is supplied from the power supply line 34 to the second gate terminal of the transistor 107. Thus, the threshold voltage of the transistor 107 can be controlled to be approximately 0 V; therefore, the load of the transistor 106 can be prevented from being large.

When the transistor 105 and the transistor 107 are turned on, the potential of the node A is increased. When the transistor 109 is turned on, the potential of the node B is decreased. When the potential of the node A reaches $V_{AH}$ ($V_{AH}$=VDD−Vth$_{105}$−Vth$_{107}$), the transistor 105 and the transistor 107 are turned off and the node A is brought into a floating state while keeping its potential at $V_{AH}$.

When the potential of the node A becomes $V_{AH}$, the transistor 101 and the transistor 103 are turned on. Here, since CLK1 is an L-level signal, VSS is output from the output terminal 26 and the output terminal 27.

In the second period 52, an H-level signal is input to the input terminal 21 as CLK1. Since the transistor 101 and the transistor 103 are in an on state, the potential of the output terminal 26 and the potential of the output terminal 27 are increased. Accordingly, the potentials input to the second gate terminal of the transistor 101 and the second gate terminal of the transistor 103 are also increased. Further, capacitance is generated between the first gate terminal of the transistor 101 and the second terminal of the transistor 101, whereby the first gate terminal and the second terminal are capacitively coupled. Similarly, capacitance is generated between the first gate terminal of the transistor 103 and the second terminal of the transistor 103, whereby the first gate terminal and the second terminal are capacitively coupled. Thus, the potential of the node A in a floating state is increased as the potential of the output terminal 26 and the potential of the output terminal 27 are increased (bootstrap operation). As a result, the potential of the node A becomes higher than VDD+Vth$_{101}$, and VDD is output from the output terminal 26 and the output terminal 27 as SROUT1 and OUT(1), respectively (see FIG. 9B). At that time, the second gate terminal of the transistor 101 and the second gate terminal of the transistor 103 are connected to the output terminal 26, and therefore, VDD is supplied to the second gate terminal of the transistor 101 and the second gate terminal of the transistor 103. Accordingly, the threshold voltages of the transistor 101 and the transistor 103 shift in the negative direction, whereby Vg−Vth becomes large. Thus, time required for charging the output terminal 27 can be shorter. The threshold voltages of the transistor 101 and the transistor 103 can be prevented from being increased, whereby current can be increased when the transistor 101 and the transistor 103 are in an on state. Therefore, layout area and power consumption can be reduced.

In the third period 53, an H-level signal is input to the input terminal 22 as CLK2, whereby VDD is supplied to the first gate terminal of the transistor 108; accordingly, the transistor 108 is turned on. Accordingly, the potential of the node B is increased. When the potential of the node B rises, the transistor 102, the transistor 104, and the transistor 106 are turned on and the potential of the node A falls. Accordingly, VSS is output from the output terminal 26 and the output terminal 27 as SROUT1 and OUT(1), respectively (see FIG. 9C).

In the fourth period 54, an L-level signal is input to the input terminal 22 as CLK2, whereby VSS is supplied to the first gate terminal of the transistor 108; accordingly, the transistor 108 is turned off. Further, an H-level signal is input to the input terminal 25 as SROUT3, whereby VDD is supplied to the first gate terminal of the transistor 111 and the second gate terminal of the transistor 111; accordingly, the transistor 111 is turned on. Thus, the potential of the node A and the potential of the node B are kept at those in the third period 53, and the potential of the output terminal 26 and the potential output from the output terminal 27 as SROUT1 and OUT(1), respectively are kept at VSS (see FIG. 10A). Here, an H-level signal is input to the second gate terminal of the transistor 111, whereby the threshold voltage of the transistor 111 shifts in the negative direction and then the transistor 111 can be function as a normally-on transistor; therefore, on-state current can be increased.

In the fifth period 55, an L-level signal is input to the input terminal 25 as SROUT3, whereby the potential of the node B is kept. Thus, the on states of the transistor 102, the transistor 104, and the transistor 106 are kept and the potentials output from the output terminal 26 and the output terminal 27 as SROUT1 and OUT(1), respectively are kept at VSS (see FIG. 10B).

Note that the potential of the node B usually falls due to the off-state current of a transistor, for example. In contrast, a transistor with a sufficiently small off-state current (e.g., a transistor including an oxide semiconductor) does not have such a problem. Note that in order to suppress the fall in the potential of the node B, a capacitor may be provided. The capacitor provided in this case is electrically connected to the first gate terminal of the transistor 102, the first gate terminal of the transistor 104, the first gate terminal of the transistor 106, the first terminal of the transistor 108, and the first terminal of the transistor 109.

Note that when an H-level signal is input to the input terminal 22 as CLK2 in the subsequent period, VDD is supplied to the first gate terminal of the transistor 108, whereby the transistor 108 is turned on; accordingly, a potential is regularly supplied to the node B. Therefore, even when a transistor having a comparatively large off-state current is used, malfunctions of the pulse signal output circuit can be prevented.

The methods and structures described in this embodiment can be combined as appropriate with any of the methods and structures described in the other embodiments.

Embodiment 3

Figure 11A:
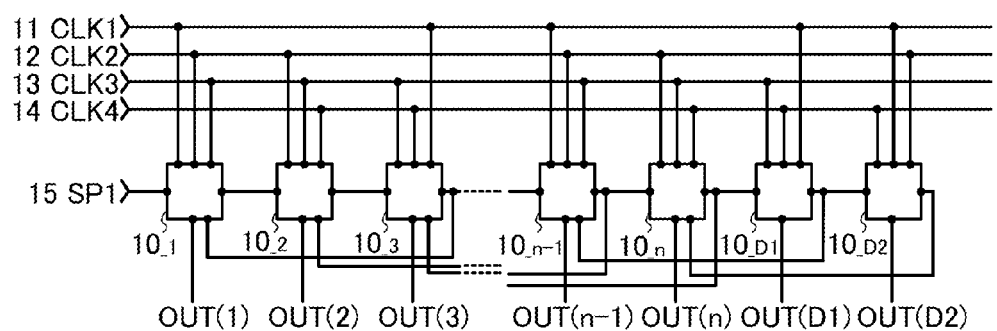
FIGS. 11A to 11C illustrate configuration examples of a pulse signal output circuit and a shift register.
Figure 11B:
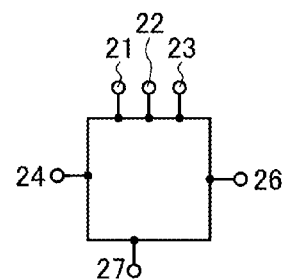
Figure 11C:
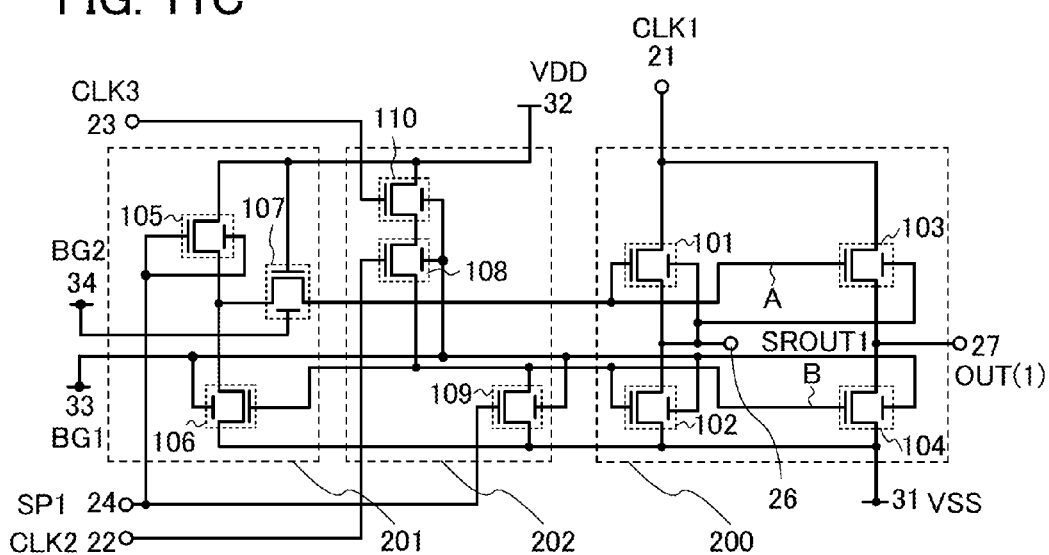

In this embodiment, configuration examples of a pulse signal output circuit and a shift register which are different modes from the pulse signal output circuit and the shift register described in the above embodiment are described with reference to FIGS. 11A to 11C.

The configuration of the shift register described in this embodiment is similar to that of the shift register described in the above embodiment. One of differences between them is that a first dummy pulse signal output circuit $10\_{D1}$ and a second dummy pulse signal output circuit $10\_{D2}$ are provided in subsequent stages of the n-th pulse signal output circuit $10\_n$ (see FIG. 11A). The first dummy pulse signal output circuit $10\_{D1}$ and the second dummy pulse signal output circuit $10\_{D2}$ have a function of supplying a pulse signal to the input terminals 25 in the (n−1)th and n-th pulse signal output circuits $10\_{n-1}$ and $10\_n$.

A pulse signal output circuit is not provided in subsequent stages of the first dummy pulse signal output circuit $10\_{D1}$ and the second dummy pulse signal output circuit $10\_{D2}$. That is, a pulse signal is not input to the first dummy pulse signal output circuit $10\_{D1}$ and the second dummy pulse signal output circuit $10\_{D2}$ from their subsequent stages (in this case, the stages following their respective next stages), which is different from the first to n-th pulse signal output circuits. Therefore, a terminal corresponding to each of the input terminals 25 in the first to n-th pulse signal output circuits is not provided therein (see FIGS. 11B and 11C). Further, the transistor 111 which is related to the input terminal 25 is also not provided (see FIG. 11C).

The function of the dummy pulse signal output circuits (the first and second dummy pulse signal output circuits) is to output an appropriate pulse signal to the pulse signal output circuits in normal stages (the (n−1)th and n-th pulse signal output circuits); therefore, the dummy pulse signal output circuits need to have the ability to charge the node B sufficiently. Here, in the first to n-th pulse signal output circuits, the sizes of the transistor 108 and the transistor 110 are made small (for example, the channel width W is made small, or the ratio W/L of the channel width W to the channel length L is made small) so that the charging ability is ensured by the transistor 111, in order to reduce power consumption due to an input of the clock signal. On the other hand, in the dummy pulse signal output circuits, the transistor 111 is not provided; therefore, the sizes of the transistor 108 and the transistor 110 need to be large to compensate for a lack of the charging ability of the transistor 111.

Specifically, for example, each of the channel widths W (or the ratios W/L of the channel widths W to the channel lengths L) of the transistors 108 in the first and second dummy pulse signal output circuits may be made larger than each of the channel widths W (or the ratios W/L of the channel widths W to the channel lengths L) of the transistors 108 in the first to n-th pulse signal output circuits, or each of the channel widths W (or the ratios W/L of the channel widths W to the channel lengths L) of the transistors 110 in the first and second dummy pulse signal output circuits may be made larger than each of the channel widths W (or the ratios W/L of the channel widths W to the channel lengths L) of the transistors 110 in the first to n-th pulse signal output circuits. With such a structure, power consumption in the pulse signal output circuits in the normal stages (the (n−1)th and n-th pulse signal output circuits) can be reduced, and a shift register operating appropriately can be obtained.

Note that the basic configuration of the dummy pulse signal output circuits is similar to that of the pulse signal output circuit described in the above embodiment except for the above difference. The pulse signal generation circuit 200 includes the transistors 101 to 104. The first input signal generation circuit 201 includes the transistors 105 to 107. The second input signal generation circuit 202 includes the transistors 108 to 110.

The operation of the dummy pulse signal output circuits is also similar to that of the pulse signal output circuit described in the above embodiment except for the point that an output from their subsequent stages is not input. Therefore, the above embodiment can be referred to for a detailed description thereof. Note that the transistor 110 is not necessarily provided. Further, in the dummy pulse signal output circuits, at least an output to the pulse signal output circuits in the normal stages (the (n−1)th and n-th pulse signal output circuits) needs to be ensured; therefore, the number of systems of the output terminals is not limited to two, and may be one. That is, the output terminal 26 or the output terminal 27 can be omitted. Note that in this case, a transistor attached to the output terminal that is to be omitted (for example, in the case where the output terminal 27 is omitted, the transistor 103 and the transistor 104) may be omitted as appropriate.

The methods and structures described in this embodiment can be combined as appropriate with any of the methods and structures described in the other embodiments.

Embodiment 4

In this embodiment, examples of transistors which can be used in the pulse signal output circuit and the shift register described in the above embodiment are described with reference to FIGS. 12A and 12B.

Figure 12A:
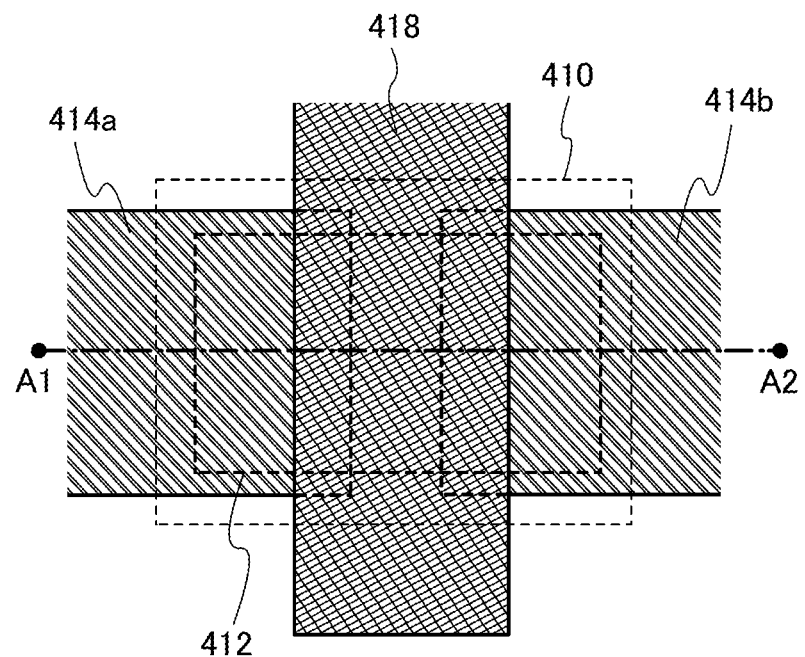
FIGS. 12A and 12B illustrate a configuration example of a transistor.
Figure 12B:
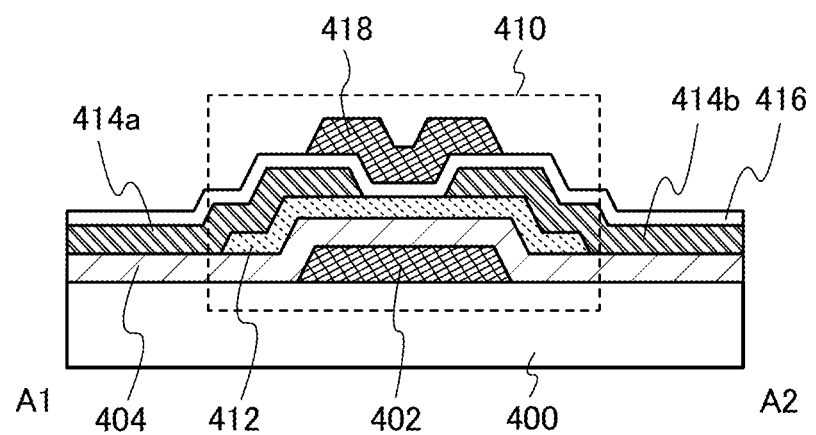

FIG. 12A is a top view of the transistor and FIG. 12B is an example of a cross-sectional view taken along line A1-A2 in FIG. 12A. The transistor illustrated in FIGS. 12A and 12B includes an oxide semiconductor as a semiconductor. An advantage of the use of an oxide semiconductor is high mobility and small off-state current which can be obtained by a simple low-temperature process.

As illustrated in FIG. 12B, a transistor 410 includes a substrate 400 having an insulating surface, a gate electrode layer 402, a gate insulating layer 404, an oxide semiconductor layer 412, a drain electrode layer 414a, and a source electrode layer 414b. In addition, a gate insulating layer 416 which is in contact with the oxide semiconductor layer 412 is provided and a gate electrode layer 418 is further provided over the gate insulating layer 416. Note that the gate electrode layer 402 and the gate electrode layer 418 correspond to the first gate terminal and the second gate terminal in the above embodiment, respectively. The drain electrode layer 414a and the source electrode layer 414b correspond to the first terminal and the second terminal, respectively.

In this embodiment, the oxide semiconductor layer 412 is used as a semiconductor layer. The transistor 410 including the oxide semiconductor layer 412 has extremely small off-state current. Thus, when such transistors are used in the pulse signal output circuit and the shift register, the potential of each node can be held easily, so that the possibility of malfunctions of the pulse signal output circuit and the shift register can be markedly lowered.

In the transistor 410 illustrated in FIGS. 12A and 12B, the drain electrode layer 414a and the source electrode layer 414b partly overlap with the gate electrode layer 402; however, it is also acceptable that the drain electrode layer 414a and the source electrode layer 414b do not overlap with the gate electrode layer 402.

The oxide semiconductor is non-single-crystal and may be either amorphous or polycrystalline. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor in an amorphous state can be obtained. In order to improve the surface flatness, the oxide semiconductor is preferably formed over a flat surface. Specifically, the oxide semiconductor may be formed over a surface with the average surface roughness ($R_a$) of less than or equal to 1 nm, preferably less than or equal to 0.3 nm, more preferably less than or equal to 0.1 nm.

Note that the average surface roughness ($R_a$) is obtained by expanding, into three dimensions, arithmetic mean surface roughness that is defined by JIS B 0601: 2001 (ISO4287: 1997) so as to be able to apply it to a curved surface. $R_a$ can be expressed as an "average value of the absolute values of deviations from a reference surface to a designated surface" and is defined by the following formula.

[FORMULA 8]

$$Ra = \frac{1}{S_0} \int_{y_1}^{y_2} \int_{x_1}^{x_2} F(x, y) \, dX \, dY \qquad (8)$$

Here, the specific surface is a surface which is a target of roughness measurement, and is a quadrilateral region which is specified by four points represented by the coordinates ($x_1$, $y_1$, $f(x_1, y_1)$), ($x_1$, $y_2$, $f(x_1, y_2)$), ($x_2$, $y_1$, $f(x_2, y_1)$), and ($x_2$, $y_2$, $f(x_2, y_2)$). $S_0$ represents the area of a rectangle which is obtained by projecting the specific surface on the xy plane, and $Z_0$ represents the height of the reference surface (the average height of the specific surface). $R_a$ can be measured using an atomic force microscope (AFM).

As the oxide semiconductor layer 412, an oxide semiconductor layer including a crystal and having crystallinity (crystalline oxide semiconductor layer) can be used. The crystals in the crystalline oxide semiconductor layer may have crystal axes oriented in random directions or in a certain direction.

For example, an oxide semiconductor layer including a crystal having a c-axis which is substantially perpendicular to a surface of the oxide semiconductor layer can be used as the crystalline oxide semiconductor layer.

The oxide semiconductor layer including a crystal having a c-axis which is substantially perpendicular to the surface of the oxide semiconductor layer has neither a single crystal structure nor an amorphous structure, but is an oxide semiconductor layer including a crystal with c-axis alignment (also referred to as a c-axis aligned crystalline oxide semiconductor (CAAC-OS)). Note that the oxide semiconductor layer partly includes a grain boundary in some cases.

The CAAC-OS film is an oxide semiconductor film including a crystal with c-axis alignment which has a triangular or hexagonal atomic arrangement when seen from the direction perpendicular to an a-b plane, a surface, or an interface. In the crystal, metal atoms are arranged in a layered manner along the direction perpendicular to a c-axis, or metal atoms and oxygen atoms are arranged in a layered manner along the direction perpendicular to a c-axis, and the direction of the a-axis or the b-axis is varied in the a-b plane (or the surface or the interface) (the crystal rotates around the c-axis). A CAAC-OS film is a thin film including crystals crystallized along the c-axis but alignment along the a-b plane does not necessarily appear.

In a broad sense, a CAAC-OS film includes a non-single-crystal and includes a phase which has a triangular, hexagonal, regular triangular, or regular hexagonal atomic arrangement when seen from the direction perpendicular to the a-b plane and in which metal atoms are arranged in a layered manner, or metal atoms and oxygen atoms are arranged in a layered manner when seen from the direction perpendicular to the c-axis direction.

The CAAC-OS film is not a single crystal film, but this does not mean that the CAAC-OS film is composed of only an amorphous component. Although the CAAC-OS film includes a crystallized portion (crystalline portion), a boundary between one crystalline portion and another crystalline portion is not clear in some cases.

Nitrogen may be substituted for part of oxygen that is a constituent element of the CAAC-OS film. The c-axes of individual crystalline portions included in the CAAC-OS film may be aligned in one direction (e.g., a direction perpendicular to a surface of a substrate over which the CAAC-OS film is formed or the top surface, a film surface, or an interface of the CAAC-OS film). Further or alternatively, the normals of the a-b planes of the individual crystalline portions included in a thin film including CAAC-OS may be aligned in one direction (e.g., the direction perpendicular to the surface of the substrate, the top surface, the film surface, or the interface of the CAAC-OS film).

The oxide semiconductor layer is used in a transistor, whereby it is possible to obtain a highly reliable semiconductor device in which changes in the electrical characteristics of the transistor due to irradiation with visible light or ultraviolet light can be suppressed.

There are three methods for obtaining an oxide semiconductor layer having c-axis alignment. The first is a method in which an oxide semiconductor layer is deposited at a temperature higher than or equal to 200° C. and lower than or equal to 500° C. such that the c-axis is substantially perpendicular to the top surface. The second is a method in which an oxide semiconductor layer is deposited thin, and is subjected to heat treatment at a temperature(s) higher than or equal to 200° C. and lower than or equal to 700° C., so that the c-axis is substantially perpendicular to the top surface. The third is a method in which a first-layer oxide semiconductor layer is deposited thin, and is subjected to heat treatment at a temperature(s) higher than or equal to 200° C. and lower than or equal to 700° C., and a second-layer oxide semiconductor layer is deposited thereover, so that the c-axis is substantially perpendicular to the top surface.

The oxide semiconductor layer 412 has a thickness greater than or equal to 1 nm and less than or equal to 30 nm (preferably greater than or equal to 5 nm and less than or equal to 10 nm) and can be formed by a sputtering method, a molecular beam epitaxy (MBE) method, a CVD method, a pulse laser deposition method, an atomic layer deposition (ALD) method, or the like as appropriate. The oxide semiconductor layer 412 may be formed with a sputtering apparatus which performs deposition in the state where top surfaces of a plurality of substrates are substantially perpendicular to a top surface of a sputtering target.

An oxide semiconductor used for a semiconductor layer of this embodiment is preferably highly purified to include impurities, which is not main components of the oxide semiconductor, as little as possible in such a manner that hydrogen, which is an n-type impurity, is removed from the oxide semiconductor.

Note that the purified oxide semiconductor has extremely few carriers, and the carrier density is lower than $1\times10^{14}/cm^3$, preferably lower than $1\times10^{12}/cm^3$, further preferably lower than $1\times10^{11}/cm^3$. Such few carriers enable off-state current to be small enough.

Specifically, in the transistor including the above-described oxide semiconductor layer, the off-state current density per channel width of 1 μm at room temperature (25° C.) can be 100 zA/μm ($1\times10^{-19}$ A/μm) or less, or further 10 zA/μm ($1\times10^{-20}$ A/μm) or less under conditions where the channel length L of the transistor is 10 μm and the source-drain voltage is 3 V.

The transistor 410 including the purified oxide semiconductor layer hardly has temperature dependence of an on-state current and also has an extremely small off-state current.

Next, a manufacturing process of the transistor 410 illustrated in FIGS. 12A and 12B is described with reference to FIGS. 13A to 13E.

First, a conductive film is formed over the substrate 400 having an insulating surface, and then, the gate electrode layer 402 are formed in a photolithography process. Note that a resist mask used in the photolithography process may be formed by an inkjet method. Formation of the resist mask by an inkjet method needs no photomask; thus, manufacturing cost can be reduced.

There is no particular limitation on a substrate that can be used as the substrate 400 having an insulating surface as long as it has heat resistance enough to withstand heat treatment performed later. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon or silicon carbide; a compound semiconductor substrate of silicon germanium or the like; an SOI substrate; or the like can be used as the substrate 400, or such a substrate with a semiconductor element provided thereover can be used as the substrate 400.

The semiconductor device may be manufactured using a flexible substrate as the substrate 400. In order to manufacture a flexible semiconductor device, the transistor 410 including the oxide semiconductor layer 412 may be directly formed over a flexible substrate. Alternatively, the transistor 410 including the oxide semiconductor layer 412 may be formed over a formation substrate, and then, the transistor 410 may be separated and transferred to a flexible substrate. Note that in order to separate the transistor from the manufacturing substrate and transfer it to the flexible substrate, a separation layer may be provided between the manufacturing substrate and the transistor 410 including the oxide semiconductor layer 412.

As a material of the gate electrode layer 402, a metal material such as molybdenum, titanium, tantalum, tungsten, aluminum, copper, chromium, neodymium, or scandium or an alloy material containing any of these materials as its main component can be used. Alternatively, a semiconductor film typified by a polycrystalline silicon film doped with an impurity element such as phosphorus, or a silicide film such as a nickel silicide film may be used as the gate electrode layer 402. The gate electrode layer 402 has either a single-layer structure or a stacked-layer structure.

As a material of the gate electrode layer 402, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used. It is also possible that the gate electrode layer 402 has a stacked-layer structure of the above conductive material and the above metal material.

As one layer of the gate electrode layer 402 which is in contact with the gate insulating layer 404 formed later, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (InN, SnN, or the like) film can be used. These films each have a work function of 5 eV or higher, preferably 5.5 eV or higher, which enables the threshold voltage of the transistor to take a positive value when used as the gate electrode layer, so that a switching element of, what is called, normally-off type can be achieved.

Next, the gate insulating layer 404 is formed over the gate electrode layer 402.

The gate insulating layer 404 can have a thickness of 1 nm to 20 nm and can be formed by a sputtering method, an MBE method, a CVD method, a pulse laser deposition method, an ALD method, or the like as appropriate. The gate insulating layer 404 may be formed with a sputtering apparatus which performs deposition in the state where top surfaces of a plurality of substrates are substantially perpendicular to a top surface of a sputtering target.

As a material of the gate insulating layer 404, a silicon oxide film, a gallium oxide film, an aluminum oxide film, a silicon nitride film, a silicon oxynitride film, an aluminum oxynitride film, or a silicon nitride oxide film can be used. Note that the gate insulating layer 404 preferably includes oxygen in a portion which is in contact with an oxide semiconductor layer 406 formed later. In particular, the gate insulating layer 404 preferably contains a large amount of oxygen which exceeds at least the stoichiometry in (a bulk of) the film. For example, in the case where a silicon oxide film is used as the gate insulating layer 404, the composition formula is $SiO_{2+\alpha}$ ($\alpha>0$). In this embodiment, a silicon oxide film of $SiO_{2+\alpha}$ ($\alpha>0$) is used for the gate insulating layer 404. The silicon oxide film is used as the gate insulating layer 404, whereby oxygen can be supplied to the oxide semiconductor layer 406 formed later. Further, the gate insulating layer 404 is preferably formed in consideration of the size of a transistor to be formed and the step coverage with the gate insulating layer 404.

When the gate insulating layer 404 is formed using a high-k material such as hafnium oxide, yttrium oxide, hafnium silicate ($HfSi_xO_y$ ($x>0$, $y>0$)), hafnium silicate to which nitrogen is added ($HfSiO_xN_y$ ($x>0$, $y>0$)), hafnium aluminate ($HfAl_xO_y$ ($x>0$, $y>0$)), or lanthanum oxide, gate leakage current can be reduced. Further, the gate insulating layer 404 may have a single-layer structure or a stacked-layer structure.

Figure 13A:
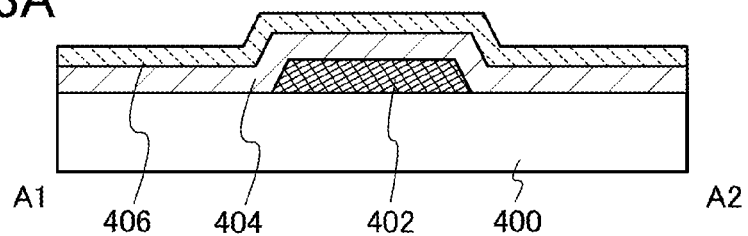
FIGS. 13A to 13E illustrate an example of a method for manufacturing a transistor.
Figure 13B:
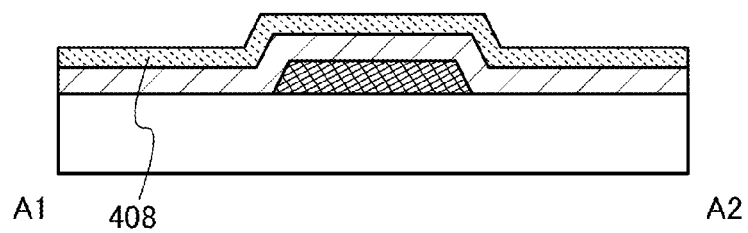

Next, the oxide semiconductor layer 406 is formed over the gate insulating layer 404 (see FIG. 13A).

In order that hydrogen or water be not contained in the oxide semiconductor film as much as possible in the formation step of the oxide semiconductor layer, it is preferable to heat the substrate provided with the gate insulating layer 404 in a preheating chamber in a sputtering apparatus as a pretreatment for formation of the oxide semiconductor layer 406 so that impurities such as hydrogen and moisture adsorbed to the substrate 400 and/or the gate insulating layer 404 are eliminated and evacuated. As an exhaustion unit provided in the preheating chamber, a cryopump is preferable.

Therefore, planarizing treatment may be performed on the region of the gate insulating layer 404 which is in contact with the oxide semiconductor layer 406. As the planarization treatment, dry-etching treatment, plasma treatment, or polishing treatment (e.g., chemical mechanical polishing (CMP)) can be used, though there is no particular limitation on the planarization treatment.

As plasma treatment, reverse sputtering in which an argon gas is introduced and plasma is generated can be performed. The reverse sputtering is a method in which voltage is applied to a substrate side with use of an RF power source in an argon atmosphere and plasma is generated in the vicinity of the substrate so that a substrate surface is modified. Note that instead of an argon atmosphere, a nitrogen atmosphere, a helium atmosphere, an oxygen atmosphere, or the like may be used. The reverse sputtering can remove particle substances (also referred to as particles or dust) attached to the top surface of the gate insulating layer 404.

As the planarization treatment, dry etching treatment, plasma treatment, or polishing treatment may be performed plural times, or these treatments may be performed in combination. In the case where the treatments are combined, the order of steps is not particularly limited and may be set as appropriate depending on the roughness of the surface of the gate insulating layer 404.

The oxide semiconductor layer 406 is preferably deposited under a condition such that much oxygen is contained (for example, by a sputtering method in an atmosphere where the proportion of oxygen is 100%) so as to be a film containing much oxygen (preferably having a region containing an excess of oxygen as compared to the stoichiometric composition ratio of the oxide semiconductor in a crystalline state).

Note that in this embodiment, a target used for forming the oxide semiconductor layer 406 by a sputtering method is, for example, an oxide target having a composition ratio of In:Ga:Zn=3:1:2 [atomic percentage], so that an In—Ga—Zn-based oxide film (IGZO film) is formed.

The relative density of the target is greater than or equal to 90% and less than or equal to 100%, preferably greater than or equal to 95% and less than or equal to 99.9%. With the use of a target having high relative density, a dense oxide semiconductor layer 406 can be formed.

A high-purity gas from which impurities such as hydrogen, water, hydroxyl groups, or hydride have been removed is preferably used as a sputtering gas for forming the oxide semiconductor layer 406.

The substrate is held in a deposition chamber kept under reduced pressure. Then, a sputtering gas from which hydrogen and moisture are removed is introduced while residual moisture in the deposition chamber is removed, and the oxide semiconductor layer 406 is formed over the substrate 400 using the above target. In order to remove moisture remaining in the deposition chamber, an entrapment vacuum pump such as a cryopump, an ion pump, or a titanium sublimation pump is preferably used. As an exhaustion unit, a turbo molecular pump to which a cold trap is added may be used. In the deposition chamber which is exhausted with the cryopump, a hydrogen atom, a compound containing a hydrogen atom, such as water ($H_2O$) (more preferably, also a compound containing a carbon atom), and the like are removed, whereby the concentration of an impurity in the oxide semiconductor layer 406 formed in the deposition chamber can be reduced.

The gate insulating layer 404 and the oxide semiconductor layer 406 are preferably formed in succession without exposure to the air. When the gate insulating layer 404 and the oxide semiconductor layer 406 are formed in succession without exposure to the air, impurities such as hydrogen and moisture can be prevented from being adsorbed onto a surface of the gate insulating layer 404.

Next, heat treatment is performed to remove excess hydrogen (including water and a hydroxyl group) in the oxide semiconductor layer 406 (dehydration or dehydrogenation). By performing the heat treatment on the oxide semiconductor layer 406, an oxide semiconductor layer 408 from which excess hydrogen is removed can be formed (see FIG. 13B). The temperature of the heat treatment is higher than or equal to 300° C. and lower than or equal to 700° C., or lower than the strain point of the substrate. The heat treatment can be performed under reduced pressure, a nitrogen atmosphere, or the like. For example, after the substrate is put in an electric furnace which is a kind of heat treatment apparatus, the oxide semiconductor layer 406 is subjected to heat treatment at 450° C. for one hour in a nitrogen atmosphere.

Further, a heat treatment apparatus used is not limited to an electric furnace, and a device for heating a process object by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows. The substrate is put in an inert gas heated at a high temperature of 650° C. to 700° C., is heated for several minutes, and is taken out of the inert gas.

Note that in heat treatment, it is preferable that moisture, hydrogen, and the like be not contained in nitrogen or a rare gas such as helium, neon, or argon. The purity of nitrogen or the rare gas such as helium, neon, or argon which is introduced into the heat treatment apparatus is set to preferably 6N (99.9999%) or higher, further preferably 7N (99.99999%) or higher (that is, the impurity concentration is preferably 1 ppm or lower, further preferably 0.1 ppm or lower).

In addition, after the oxide semiconductor layer 406 is heated by the heat treatment, a high-purity oxygen gas, a high-purity dinitrogen monoxide gas, or ultra dry air (the moisture amount is lower than or equal to 20 ppm (−55° C. by conversion into a dew point), preferably lower than or equal to 1 ppm, or further preferably lower than or equal to 10 ppb, in the case where measurement is performed with use of a dew point meter of a cavity ring down laser spectroscopy (CRDS) system) may be introduced into the same furnace. It is preferable that water, hydrogen, or the like be not contained in the oxygen gas or the dinitrogen monoxide gas. Alternatively, the purity of the oxygen gas or the dinitrogen monoxide gas which is introduced into the heat treatment apparatus is preferably 6N or higher, further preferably 7N or higher (i.e., the impurity concentration in the oxygen gas or the dinitrogen monoxide gas is preferably 1 ppm or lower, further preferably 0.1 ppm or lower). By the effect of the oxygen gas or the dinitrogen monoxide gas, oxygen which is a main component of the oxide semiconductor and which has been reduced at the same time as the step for removing impurities by dehydration or dehydrogenation can be supplied.

The heat treatment for dehydration or dehydrogenation may be performed plural times, and may also serve as another heat treatment.

When the heat treatment for dehydration or dehydrogenation is performed in the state where the gate insulating layer 404 is covered with the oxide semiconductor layer 406 which has not been processed into the island-shaped oxide semiconductor layer 412, the outward diffusion of oxygen contained in the gate insulating layer 404 can be prevented by the heat treatment, which is preferable.

The dehydration or dehydrogenation treatment may accompany elimination of oxygen which is a main constituent material of an oxide semiconductor to lead to a reduction in oxygen. There is an oxygen defect in a portion where oxygen is detached in the oxide semiconductor layer 408 and a donor level which leads to variation in the electric characteristics of a transistor is formed owing to the oxygen defect.

Thus, oxygen is preferably supplied to the oxide semiconductor layer 408 after being subjected to the dehydration or dehydrogenation treatment. By supply of oxygen to the oxide semiconductor layer, oxygen vacancies in the film can be repaired.

For example, when an oxide insulating layer containing much (excess) oxygen, which serves as an oxygen supply source, is used as the gate insulating layer 404 and is provided so as to be in contact with the oxide semiconductor layer 408, oxygen can be supplied from the oxide insulating layer to the oxide semiconductor layer. In the above structure, heat treatment may be performed as dehydration or dehydrogenation treatment in the state where the oxide semiconductor layer 408 and the oxide insulating layer are in contact with each other at least partly to supply oxygen to the oxide semiconductor layer 408.

When the gate insulating layer 404 including much (excessive) oxygen, which serves as an oxygen supply source, is provided so as to be in contact with the oxide semiconductor layer 408, oxygen can be supplied to the oxide semiconductor layer 408 from the gate insulating layer 404. By supply of oxygen to the oxide semiconductor layer 408, oxygen deficiency in the oxide semiconductor layer 408 can be filled.

Figure 13C:
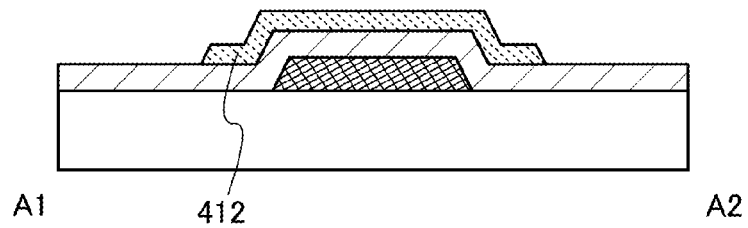

Next, the oxide semiconductor layer 408 is subjected to a photolithography process, whereby the island-shaped oxide semiconductor layer 412 is formed (see FIG. 13C). Note that a resist mask used in the photolithography process may be formed by an inkjet method. Formation of the resist mask by an inkjet method needs no photomask; thus, manufacturing cost can be reduced.

Note that the etching of the oxide semiconductor layer 408 may be dry etching, wet etching, or both dry etching and wet etching. An example of an etchant which can be used for wet etching of the oxide semiconductor layer 408 is a mixed solution of phosphoric acid, acetic acid, and nitric acid. In addition, ITO07N (produced by KANTO CHEMICAL CO., INC.) may also be used.

Next, oxygen (including at least any one of oxygen radicals, oxygen atoms, and oxygen ions) may be introduced into the oxide semiconductor layer 412 in order to supply oxygen to the film.

Oxygen which is added to the oxide semiconductor layer 412 to supply oxygen to the film can highly purify the oxide semiconductor layer 412. Variation in electric characteristics of a transistor having a highly-purified oxide semiconductor layer 412 is prevented, and the transistor is electrically stable.

As a method for introducing oxygen, an ion implantation method, an ion doping method, a plasma immersion ion implantation method, plasma treatment, or the like may be used.

In the step of addition of oxygen to the oxide semiconductor layer 412, oxygen may be directly added to the oxide semiconductor layer 412 or to the oxide semiconductor layer 412 through the gate insulating layer 416 formed later. An ion implantation method, an ion doping method, a plasma immersion ion implantation method, or the like may be employed for the addition of oxygen through the gate insulating layer 416, whereas plasma treatment or the like can also be employed for the addition of oxygen directly into an exposed oxide semiconductor layer 412.

The addition of oxygen to the oxide semiconductor layer can be performed anytime after dehydration or dehydrogenation treatment is performed thereon. Further, oxygen may be added plural times into the dehydrated or dehydrogenated oxide semiconductor layer.

Figure 13D:
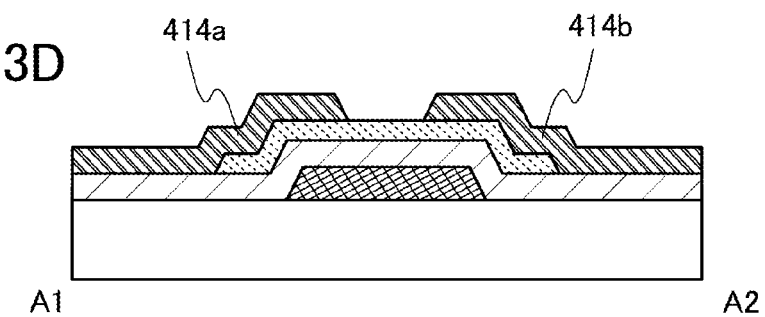

Next, a conductive film which is to be the drain electrode layer 414a and the source electrode layer 414b (including wiring formed of the same layer as the drain electrode layer 414a and the source electrode layer 414b) is formed over the oxide semiconductor layer 412, and then, the drain electrode layer 414a and the source electrode layer 414b are formed by the photolithography process (see FIG. 13D).

The conductive film is formed using a material that can withstand heat treatment in a later step. As the conductive film used for forming the drain electrode layer 414a and the source electrode layer 414b, it is possible to use, for example, a metal film containing an element selected from Al, Cr, Cu, Ta, Ti, Mo, and W, a metal nitride film containing any of these elements as its component (a titanium nitride film, a molybdenum nitride film, or a tungsten nitride film), or the like. A metal film having a high melting point such as Ti, Mo, W, or the like or a metal nitride film of any of these elements (a titanium nitride film, a molybdenum nitride film, and a tungsten nitride film) may be stacked on one of or both of a lower side or an upper side of a metal film of Al, Cu, or the like. Alternatively, the conductive film for forming the drain electrode layer 414a and the source electrode layer 414b may be formed using conductive metal oxide. As the conductive metal oxide, indium oxide ($In_2O_3$), tin oxide ($SnO_2$), zinc oxide (ZnO), indium oxide-tin oxide ($In_2O_3$—$SnO_2$, abbreviated to ITO), indium oxide-zinc oxide ($In_2O_3$—ZnO), or any of these metal oxide materials containing silicon oxide can be used.

Next, the gate insulating layer 416 is formed to cover the oxide semiconductor layer 412, the drain electrode layer 414a, and the source electrode layer 414b. Note that the gate insulating layer 416 can be formed using a material and a method which are similar to those of the gate insulating layer 404, and as such detailed description thereof is omitted.

Figure 13E:
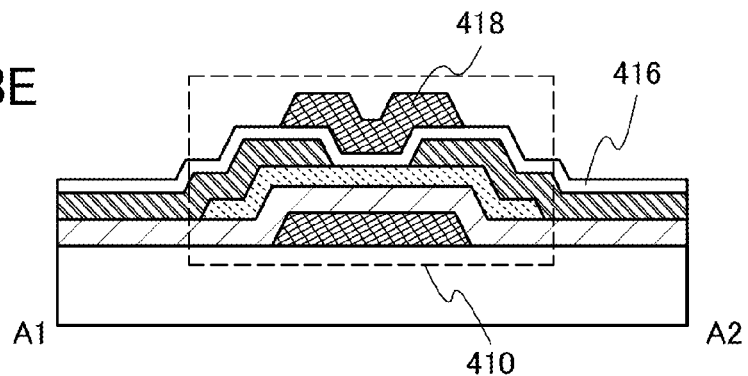

Next, a conductive film which is to be the gate electrode layer 418 is formed over the gate insulating layer 416, and then, the gate electrode layer 418 is formed by a photolithography process (see FIG. 13E). Note that the gate electrode layer 418 can be formed using a material and a method which are similar to those of the gate electrode layer 402, and as such detailed description thereof is omitted.

Through the above process, the transistor 410 is formed (see FIG. 13E).

Note that a protective insulating layer may be further formed over the gate insulating layer 416 and the gate electrode layer 418. The protective insulating layer prevents entry of hydrogen, water, and the like from the outside. As the protective insulating layer, a silicon nitride film, an aluminum nitride film, or the like can be used, for example. The formation method of the protective insulating layer is not particularly limited; however, an RF sputtering method is suitable for forming the protective insulating layer because it achieves high productivity.

Further, a planarization insulating film may be formed over the protective insulating layer in order to reduce surface unevenness due to the transistor. For the planarization insulating film, an organic material such as polyimide, acrylic, or benzocyclobutene can be used. Other than such organic materials, it is also possible to use a low-dielectric constant material (a low-k material) or the like. Note that the planarization insulating film may be formed by stacking a plurality of insulating films formed from these materials.

Note that after forming the protective insulating layer and the planarization insulating film, a heat treatment may additionally be performed in the atmosphere at 100° C. or higher and 200° C. or lower, for 1 hour or more and 30 hours or less.

A transistor which includes a purified oxide semiconductor layer and is manufactured in accordance with this embodiment as described above has a characteristic of significantly small off-state current. Therefore, with the use of the transistor, the potential of a node can be easily held. The use of such a transistor for a pulse signal output circuit and a shift register can significantly reduce the probability of causing a malfunction of the pulse signal output circuit and the shift register.

The structures, methods, and the like described in this embodiment can be combined as appropriate with any of the structures, methods, and the like described in the other embodiments.

Embodiment 5

With the use of the shift register whose example is described in any of Embodiments 1 to 3, a semiconductor device having a display function (also referred to as a display device) can be manufactured. Further, part or the whole of a driver circuit can be formed over the same substrate as a pixel portion, whereby a system-on-panel can be obtained.

As a display element used for the display device, a liquid crystal element (also referred to as a liquid crystal display element) or a light-emitting element (also referred to as a light-emitting display element) can be used. The light-emitting element includes, in its category, an element whose luminance is controlled by a current or a voltage, and specifically includes, in its category, an inorganic electroluminescent (EL) element, an organic EL element, and the like. Furthermore, a display medium whose contrast is changed by an electric effect, such as electronic ink, can be used.

Figure 14A:
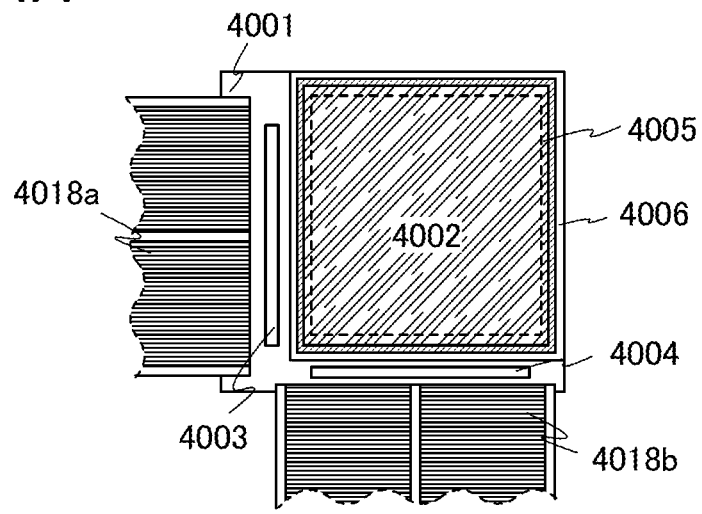
FIGS. 14A to 14C each illustrate one mode of a semiconductor device.

In FIG. 14A, a sealant 4005 is provided so as to surround a pixel portion 4002 provided over a first substrate 4001, and the pixel portion 4002 is sealed between the first substrate 4001 and a second substrate 4006. In FIG. 14A, a scan line driver circuit 4004 and a signal line driver circuit 4003 which are formed over a substrate separately prepared are mounted in a region which is different from a region surrounded by the sealant 4005 over the first substrate 4001. Further, a variety of signals and potentials are supplied to the signal line driver circuit 4003 which is separately formed, and the scan line driver circuit 4004 or the pixel portion 4002 from flexible printed circuits (FPCs) 4018a and 4018b.

Figure 14B:
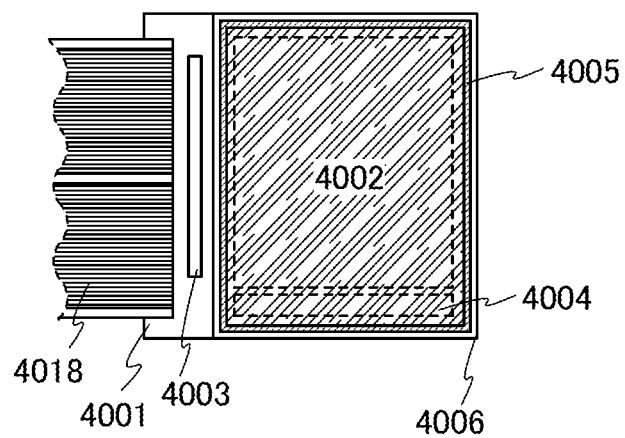
Figure 14C:
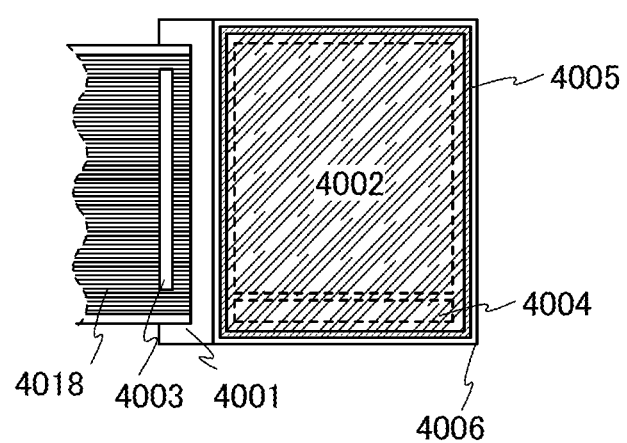

In FIGS. 14B and 14C, the sealant 4005 is provided so as to surround the pixel portion 4002 and the scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with the display element, by the first substrate 4001, the sealant 4005, and the second substrate 4006. In FIGS. 14B and 14C, the signal line driver circuit 4003 which is formed over a substrate separately prepared is mounted in a region which is different from a region surrounded by the sealant 4005 over the first substrate 4001. In FIGS. 14B and 14C, a variety of signals and potentials are supplied to the signal line driver circuit 4003 which is separately formed, and the scan line driver circuit 4004 or the pixel portion 4002 from an FPC 4018.

Although FIGS. 14B and 14C each illustrate an example in which the signal line driver circuit 4003 is formed separately and mounted on the first substrate 4001, the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 14A illustrates an example in which the signal line driver circuit 4003 and the scan line driver circuit 4004 are mounted by a COG method. FIG. 14B illustrates an example in which the signal line driver circuit 4003 is mounted by a COG method. FIG. 14C illustrates an example in which the signal line driver circuit 4003 is mounted by a TAB method.

In addition, the display device includes a panel in which the display element is sealed, and a module in which an IC or the like including a controller is mounted on the panel.

Note that a display device in this specification means an image display device, a display device, or a light source (including a lighting device). Furthermore, the display device also includes the following modules in its category: a module to which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

Further, the pixel portion provided over the first substrate includes a plurality of transistors, and the transistors which are illustrated in the aforementioned embodiment as an example can be used for the transistors.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like is used. These liquid crystal materials exhibit a cholesteric phase, a smectic phase, a cubic phase, a chiral nematic phase, an isotropic phase, or the like depending on conditions.

Alternatively, a liquid crystal exhibiting a blue phase for which an alignment film is unnecessary may be used. A blue phase is one of liquid crystal phases, which is generated just before a cholesteric phase changes into an isotropic phase while temperature of a cholesteric liquid crystal is increased. Since the blue phase appears only in a narrow temperature range, a liquid crystal composition containing a chiral agent at 5 wt % or more is used for a liquid crystal layer in order to improve the temperature range. The liquid crystal composition which includes a liquid crystal showing a blue phase and a chiral agent has a short response time of 1 msec or less, has optical isotropy, which makes the alignment process unneeded, and has a small viewing angle dependence. In addition, an alignment film does not need to be provided and thus rubbing treatment is not necessary. Therefore, electrostatic discharge damage caused by the rubbing treatment can be prevented and defects and damage of the liquid crystal display device in the manufacturing process can be reduced. Thus, liquid crystal display devices can be manufactured with improved productivity.

The specific resistivity of the liquid crystal material is greater than or equal to $1 \times 10^9$ Ω·cm, preferably greater than or equal to $1 \times 10^{11}$ Ω·cm, still preferably greater than or equal to $1 \times 10^{12}$ Ω·cm. Note that the specific resistance in this specification is measured at 20° C.

The size of a storage capacitor formed in the liquid crystal display device is set in consideration of the leakage current of the transistor provided in the pixel portion or the like so that charge can be held for a predetermined period. The size of the storage capacitor may be set in consideration of the off-state current of a transistor or the like.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, or the like is used.

A normally black liquid crystal display device such as a transmissive liquid crystal display device utilizing a vertical alignment (VA) mode is preferable. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Some examples of the vertical alignment mode are given. For example, a multi-domain vertical alignment (MVA) mode, a patterned vertical alignment (PVA) mode, an ASV mode, or the like can be used. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be employed. Further, color elements controlled in a pixel at the time of color display are not limited to three colors: R, G, and B (R, G, and B correspond to red, green, and blue, respectively). For example, R, G, B, and W (W corresponds to white); R, G, B, and one or more of yellow, cyan, magenta, and the like; or the like can be used. Further, the sizes of display regions may be different between respective dots of color elements. Note that an embodiment of the present invention is not limited to the application to a display device for color display; the disclosed invention can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Because of such a mechanism, the light-emitting element is called a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions.

Further, an electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed using a single material selected from a conductive material, an insulating material, a semiconductor material, a magnetic material, a liquid crystal material, a ferroelectric material, an electroluminescent material, an electrochromic material, or a magnetophoretic material or formed using a composite material of any of these.

As the electronic paper, a display device using a twisting ball display system can be used. The twisting ball display system refers to a method in which spherical particles each colored in black and white are arranged between a first electrode layer and a second electrode layer which are electrode layers used for a display element, and a potential difference is generated between the first electrode layer and the second electrode layer to control alignment of the spherical particles, so that display is performed.

The pulse signal output circuit described in Embodiment 1 or Embodiment 2 is used for the display device whose example is described above, whereby the display device can have a variety of functions.

The structures, methods, and the like described in this embodiment can be combined as appropriate with any of the structures, methods, and the like described in the other embodiments.

Embodiment 6

A semiconductor device disclosed in this specification can be used in a variety of electronic devices (including game machines). Examples of electronic devices are a television set (also referred to as a television or a television receiver), a monitor of a computer or the like, a camera such as a digital camera or a digital video camera, a digital photo frame, a cellular phone handset (also referred to as a cellular phone or a cellular phone device), a portable game machine, a personal digital assistant, an audio reproducing device, a large game machine such as a pinball machine, and the like.

Figure 15A:
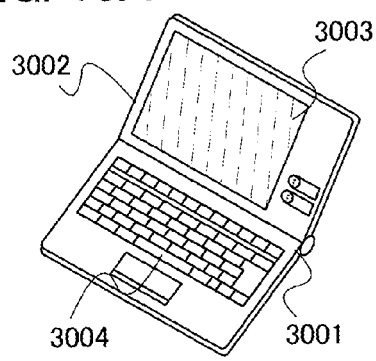
FIGS. 15A to 15F each illustrate an electronic device.

FIG. 15A illustrates a laptop personal computer which includes at least the semiconductor device disclosed in this specification as a component. The laptop personal computer includes a main body 3001, a housing 3002, a display portion 3003, a keyboard 3004, and the like.

Figure 15B:
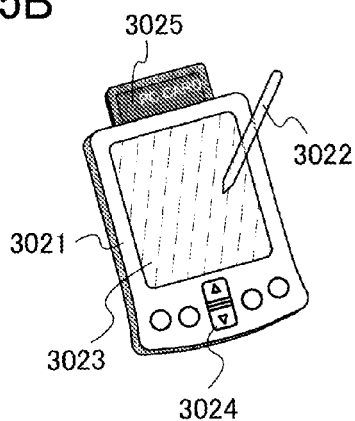

FIG. 15B illustrates a personal digital assistant (PDA) which includes at least the semiconductor device disclosed in this specification as a component. A main body 3021 is provided with a display portion 3023, an external interface 3025, operation buttons 3024, and the like. A stylus 3022 is included as an accessory for operation.

Figure 15C:
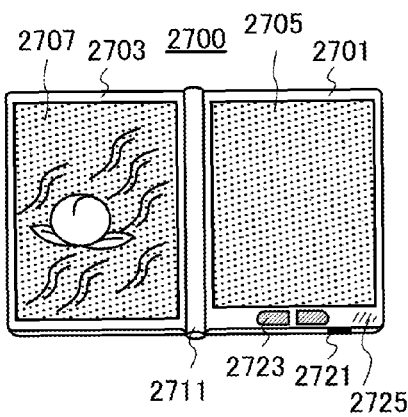

The semiconductor device disclosed in this specification can be used as an electronic paper. FIG. 15C illustrates an e-book reader which includes the electronic paper as a component. FIG. 15C illustrates an example of the e-book reader. For example, an e-book reader 2700 includes two housings 2701 and 2703. The housings 2701 and 2703 are combined with each other with a hinge 2711 so that the e-book reader 2700 can be opened and closed with the hinge 2711 used as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 15C) can display text and a display portion on the left side (the display portion 2707 in FIG. 15C) can display images.

FIG. 15C illustrates an example in which the housing 2701 includes an operation portion and the like. For example, the housing 2701 includes a power switch 2721, operation keys 2723, a speaker 2725, and the like. With the operation keys 2723, pages can be turned. Note that a keyboard, a pointing device, or the like may be provided on the same surface as the display portion of the housing. Further, an external connection terminal (e.g., an earphone terminal or a USB terminal), a recording medium insertion portion, and the like may be provided on a back surface or a side surface of the housing. Furthermore, the e-book reader 2700 may function as an electronic dictionary.

Further, the e-book reader 2700 may transmit and receive data wirelessly. Through wireless communication, desired book data or the like can be purchased and downloaded from an electronic book server.

Figure 15D:
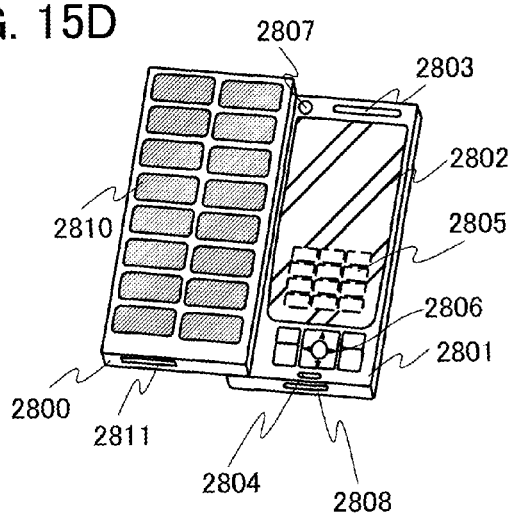

FIG. 15D illustrates a cellular phone which includes at least the semiconductor device disclosed in this specification as a component. The cellular phone includes two housings 2800 and 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 for storing electricity in a personal digital assistant, an external memory slot 2811, and the like. Further, an antenna is incorporated in the housing 2801.

Further, the display panel 2802 includes a touch panel. A plurality of operation keys 2805 which are displayed as images are indicated by dashed lines in FIG. 15D. Note that the cellular phone includes a boosting circuit for raising a voltage output from the solar cell 2810 to a voltage necessary for each circuit.

The display direction of the display panel 2802 is changed as appropriate depending on a usage pattern. Further, since the cellular phone includes the camera lens 2807 on the same surface as the display panel 2802, it can be used as a video phone. The speaker 2803 and the microphone 2804 can be used for videophone calls, recording, playback, and the like as well as voice calls. Furthermore, the housings 2800 and 2801 which are developed as illustrated in FIG. 15D can overlap with each other by sliding; thus, the size of the cellular phone can be decreased, which makes the cellular phone suitable for being carried.

The external connection terminal 2808 can be connected to an AC adapter and a variety of cables such as a USB cable, and charging and data communication with a personal computer or the like are possible. Further, a large amount of data can be stored and moved by insertion of a storage medium into the external memory slot 2811.

Further, the cellular phone may have an infrared communication function, a television reception function, or the like in addition to the above functions.

Figure 15E:
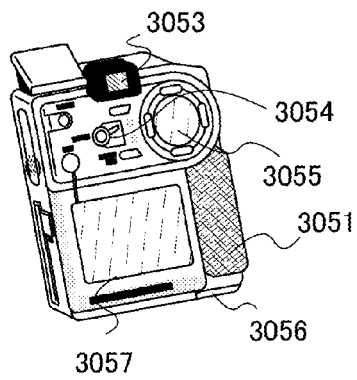

FIG. 15E illustrates a digital video camera which includes at least the semiconductor device disclosed in this specification as a component. The digital video camera includes a main body 3051, a first display portion 3057, an eyepiece portion 3053, operation switches 3054, a second display portion 3055, a battery 3056, and the like.

Figure 15F:
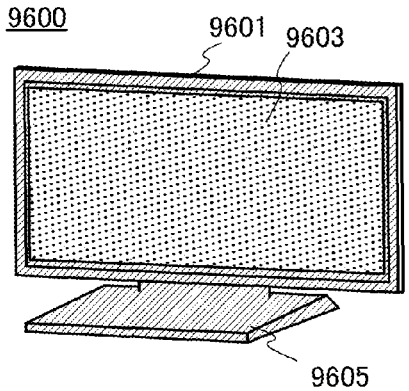

FIG. 15F illustrates an example of a television set which includes at least the semiconductor device disclosed in this specification as a component. In a television set 9600, a display portion 9603 is incorporated in a housing 9601. The display portion 9603 can display images. Here, the housing 9601 is supported by a stand 9605.

The television set 9600 can be operated by an operation switch of the housing 9601 or a remote control. Further, the remote control may include a display portion for displaying data output from the remote control.

Note that the television set 9600 includes a receiver, a modem, and the like. With the receiver, general television broadcasts can be received. Further, when the television set is connected to a communication network with or without wires via the modem, one-way (from a transmitter to a receiver) or two-way (between a transmitter and a receiver or between receivers) data communication can be performed.

The structures, methods, and the like described in this embodiment can be combined as appropriate with any of the structures, methods, and the like described in the other embodiments.

This application is based on Japanese Patent Application serial no. 2011-172111 filed with Japan Patent Office on Aug. 5, 2011, the entire contents of which are hereby incorporated by reference.

What is claimed is:

1. A pulse signal output circuit comprising:
a first transistor to a tenth transistor each comprising a first terminal, a second terminal, a first gate terminal, and a second gate terminal;
a first to fourth input terminals;
a first output terminal and a second output terminal; and
a first to fourth power supply lines,
wherein:
the first terminal of the first transistor is electrically connected to the first input terminal, and the second terminal of the first transistor is electrically connected to the first output terminal,
the first terminal of the second transistor is electrically connected to the first output terminal, and the second terminal of the second transistor is electrically connected to the first power supply line,
the first terminal of the third transistor is electrically connected to the first input terminal, and the second terminal of the third transistor is electrically connected to the second output terminal,
the first terminal of the fourth transistor is electrically connected to the second output terminal, and the second terminal of the fourth transistor is electrically connected to the first power supply line,
the first terminal of the fifth transistor is electrically connected to the second power supply line, and the second terminal of the fifth transistor is electrically connected to the first terminal of the sixth transistor and the first terminal of the seventh transistor,
the second terminal of the sixth transistor is electrically connected to the first power supply line, and the first gate terminal of the sixth transistor is electrically connected to the second terminal of the eighth transistor, the first terminal of the ninth transistor, the first gate terminal of the second transistor, and the first gate terminal of the fourth transistor,
the second terminal of the seventh transistor is electrically connected to the first gate terminal of the first transistor and the first gate terminal of the third transistor, and the first gate terminal of the seventh transistor is electrically connected to the second power supply line,
the first terminal of the eighth transistor is electrically connected to the second terminal of the tenth transistor, the first gate terminal of the eighth transistor is electrically connected to the second input terminal, and the second gate terminal of the eighth transistor is electrically connected to the third power supply line,
the second terminal of the ninth transistor is electrically connected to the first power supply line,
the first terminal of the tenth transistor is electrically connected to the second power supply line, the first gate terminal of the tenth transistor is electrically connected to the third input terminal, and the second gate terminal of the tenth transistor is electrically connected to the third power supply line,
the first output terminal is electrically connected to the second gate terminal of the first transistor and the second gate terminal of the third transistor,
the fourth input terminal is electrically connected to the first gate terminal of the fifth transistor, the second gate terminal of the fifth transistor, and the first gate terminal of the ninth transistor,
the third power supply line is electrically connected to the second gate terminal of the second transistor, the second gate terminal of the fourth transistor, the second gate terminal of the sixth transistor, and the second gate terminal of the ninth transistor, and
the fourth power supply line is electrically connected to the second gate terminal of the seventh transistor.

2. The pulse signal output circuit according to claim 1, further comprising a capacitor,
wherein the capacitor is electrically connected to the first gate terminal of the second transistor, the first gate terminal of the fourth transistor, the first gate terminal of the sixth transistor, the second terminal of the eighth transistor, and the first terminal of the ninth transistor.

3. The pulse signal output circuit according to claim 1, further comprising an eleventh transistor, wherein:
a first terminal of the eleventh transistor is electrically connected to the second power supply line, and a second terminal of the eleventh transistor is electrically connected to the first gate terminal of the second transistor, the first gate terminal of the fourth transistor, the first gate terminal of the sixth transistor, the second terminal of the eighth transistor, and the first terminal of the ninth transistor.

4. The pulse signal output circuit according to claim 1, wherein:
a second potential of the second power supply line is higher than a first potential of the first power supply line,
a third potential of the fourth power supply line is higher than the first potential and lower than the second potential, and
a fourth potential of the third power supply line is lower than the third potential.

5. The pulse signal output circuit according to claim 1, wherein:
a first clock signal is input to the first input terminal,
a second clock signal is input to the second input terminal,
a third clock signal is input to the third input terminal, and
a fourth clock signal is input to the fourth input terminal.

6. A shift register comprising the pulse signal output circuit according to claim 1.

7. The pulse signal output circuit according to claim 1, wherein a channel formation region of each of the first transistor to the tenth transistor comprises an oxide semiconductor.

8. The pulse signal output circuit according to claim 1, wherein a ratio W/L of a channel width W to a channel length L of the first transistor and a ratio W/L of a channel width W to a channel length L of the third transistor are each larger than a ratio W/L of a channel width W to a channel length L of the sixth transistor.

9. The pulse signal output circuit according to claim 1,
wherein a ratio W/L of a channel width W to a channel length L of the fifth transistor is larger than a ratio W/L of a channel width W to a channel length L of the sixth transistor, and
wherein the ratio W/L of the channel width W to the channel length L of the fifth transistor is larger than or equal to a ratio W/L of a channel width W to a channel length L of the seventh transistor.

10. The pulse signal output circuit according to claim 1, wherein a ratio W/L of a channel width W to a channel length L of the third transistor is larger than a ratio W/L of a channel width W to a channel length L of the fourth transistor.

11. A pulse signal output circuit comprising:
a first to ninth transistors each comprising a first terminal, a second terminal, a first gate terminal, and a second gate terminal;
a first to third input terminals;
a first output terminal and a second output terminal; and
a first to fourth power supply lines,
wherein:
the first terminal of the first transistor is electrically connected to the first input terminal, and the second terminal of the first transistor is electrically connected to the first output terminal,
the first terminal of the second transistor is electrically connected to the first output terminal, and the second terminal of the second transistor is electrically connected to the first power supply line,
the first terminal of the third transistor is electrically connected to the first input terminal, and the second terminal of the third transistor is electrically connected to the second output terminal, the first terminal of the fourth transistor is electrically connected to the second output terminal, and the second terminal of the fourth transistor is electrically connected to the first power supply line,
the first terminal of the fifth transistor is electrically connected to the second power supply line, and the second terminal of the fifth transistor is electrically connected to the first terminal of the sixth transistor and the first terminal of the seventh transistor,
the second terminal of the sixth transistor is electrically connected to the first power supply line, and the first gate terminal of the sixth transistor is electrically connected to the second terminal of the eighth transistor, the first terminal of the ninth transistor, the first gate terminal of the second transistor, and the first gate terminal of the fourth transistor,
the second terminal of the seventh transistor is electrically connected to the first gate terminal of the first transistor and the first gate terminal of the third transistor, and the first gate terminal of the seventh transistor is electrically connected to the second power supply line,
the first terminal of the eighth transistor is electrically connected to the first input terminal, the first gate terminal of the eighth transistor is electrically connected to the second input terminal, and the second gate terminal of the eighth transistor is electrically connected to the third power supply line,
the second terminal of the ninth transistor is electrically connected to the first power supply line,
the first output terminal is electrically connected to the second gate terminal of the first transistor and the second gate terminal of the third transistor,
the third input terminal is electrically connected to the first gate terminal of the fifth transistor, the second gate terminal of the fifth transistor, and the first gate terminal of the ninth transistor,
the third power supply line is electrically connected to the second gate terminal of the second transistor, the second gate terminal of the fourth transistor, the second gate terminal of the sixth transistor, and the second gate terminal of the ninth transistor, and
the fourth power supply line is electrically connected to the second gate terminal of the seventh transistor.

12. The pulse signal output circuit according to claim 11, further comprising a capacitor,
wherein the capacitor is electrically connected to the first gate terminal of the second transistor, the first gate terminal of the fourth transistor, the first gate terminal of the sixth transistor, the second terminal of the eighth transistor, and the first terminal of the ninth transistor.

13. The pulse signal output circuit according to claim 11, further comprising a tenth transistor, wherein:
a first terminal of the tenth transistor is electrically connected to the second power supply line, and
a second terminal of the tenth transistor is electrically connected to the first gate terminal of the second transistor, the first gate terminal of the fourth transistor, the first gate terminal of the sixth transistor, the second terminal of the eighth transistor, and the first terminal of the ninth transistor.

14. The pulse signal output circuit according to claim 11, wherein:
a second potential of the second power supply line is higher than a first potential of the first power supply line,
a third potential of the fourth power supply line is higher than the first potential and lower than the second potential, and a fourth potential of the third potential power supply line is lower than the third potential.

15. The pulse signal output circuit according to claim 11, wherein:
a first clock signal is input to the first input terminal,
a second clock signal is input to the second input terminal, and
a third clock signal is input to the third input terminal.

16. A shift register comprising the pulse signal output circuit according to claim 11.

17. The pulse signal output circuit according to claim 11, wherein a channel formation region of each of the first transistor to the ninth transistor comprises an oxide semiconductor.

18. The pulse signal output circuit according to claim 11, wherein a ratio W/L of a channel width W to a channel length L of the first transistor and a ratio W/L of a channel width W to a channel length L of the third transistor are each larger than a ratio W/L of a channel width W to a channel length L of the sixth transistor.

19. The pulse signal output circuit according to claim 11, wherein a ratio W/L of a channel width W to a channel length L of the fifth transistor is larger than a ratio W/L of a channel width W to a channel length L of the sixth transistor, and
wherein the ratio W/L of the channel width W to the channel length L of the fifth transistor is larger than or equal to a ratio W/L of a channel width W to a channel length L of the seventh transistor.

20. The pulse signal output circuit according to claim 11, wherein a ratio W/L of a channel width W to a channel length L of the third transistor is larger than a ratio W/L of a channel width W to a channel length L of the fourth transistor.

* * * * *

UNITED STATES PATENT AND TRADEMARK OFFICE
CERTIFICATE OF CORRECTION

| | | |
|---|---|---|
| PATENT NO. | : 8,718,224 B2 | Page 1 of 1 |
| APPLICATION NO. | : 13/561499 | |
| DATED | : May 6, 2014 | |
| INVENTOR(S) | : Kouhei Toyotaka | |

It is certified that error appears in the above-identified patent and that said Letters Patent is hereby corrected as shown below:

In the Claims

Column 41, line 1, claim 14 before "power" delete "potential".

Signed and Sealed this
Twenty-fifth Day of November, 2014

Michelle K. Lee
*Deputy Director of the United States Patent and Trademark Office*